United States Patent
Dickson et al.

(10) Patent No.: US 12,015,510 B2
(45) Date of Patent: Jun. 18, 2024

(54) TRANSMITTER WITH UNIFORM DRIVER SEGMENT ACTIVITY

(71) Applicant: International Business Machines Corporation, Armonk, NY (US)

(72) Inventors: Timothy O. Dickson, Ridgefield, CT (US); Martin Cochet, South Salem, NY (US); Zeynep Toprak-Deniz, Woodbridge, CT (US); John Francis Bulzacchelli, Somers, NY (US); Jonathan E. Proesel, Mount Vernon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/827,425

(22) Filed: May 27, 2022

(65) Prior Publication Data

US 2023/0412434 A1 Dec. 21, 2023

(51) Int. Cl.
*H04L 27/04* (2006.01)
*H03M 7/16* (2006.01)

(52) U.S. Cl.
CPC ............ *H04L 27/04* (2013.01); *H03M 7/165* (2013.01)

(58) Field of Classification Search
CPC .......... H04L 27/04; H03M 7/165; H03M 7/02
USPC .................................. 375/257, 295–297, 300
See application file for complete search history.

(56) References Cited

U.S. PATENT DOCUMENTS

| | | | |
|---|---|---|---|
| 4,772,887 A * | 9/1988 | Dunkerton | H04W 88/027 455/92 |
| 6,163,283 A | 12/2000 | Schofield | |
| 8,581,760 B2 | 11/2013 | Muhammad | |
| 8,907,830 B2 | 12/2014 | Bruennert | |
| 9,762,250 B2 | 9/2017 | Perrott | |
| 9,825,643 B1 | 11/2017 | Taylor | |
| 9,991,900 B1 * | 6/2018 | Kabir | H03M 1/0673 |

(Continued)

FOREIGN PATENT DOCUMENTS

EP 1299952 B1 3/2005

OTHER PUBLICATIONS

L. R. Carley, "A Noise-Shaping Coder Topology for 15+ Bit Converters", IEEE Journal of Solid-State Circuits, vol. 24, pp. 267-273, Apr. 1989.

(Continued)

*Primary Examiner* — Emmanuel Bayard

(74) *Attorney, Agent, or Firm* — Daniel Morris; Otterstedt & Kammer PLLC

(57) ABSTRACT

A circuit includes at least three equally weighted drivers; a state variable generator; and an element selector. The latter is coupled to the drivers, has a first input from the generator, has a second input including a plurality of input thermometer-encoded data streams, and has an output of an equal number of thermometer-encoded output data streams supplied to the drivers. The element selector maps the second input to the output dynamically based on a value of the first input from the state variable generator, with an update rate that is no more than one half of a symbol-rate. A serializer is configured to provide serialized data at the symbol rate, with output coupled to one of the second input of the element selector and input of the drivers. The drivers have outputs that are combined to produce an output of the circuit at the symbol rate.

20 Claims, 23 Drawing Sheets

(56) References Cited

U.S. PATENT DOCUMENTS

| | | | |
|---|---|---|---|
| 10,541,699 B1 | 1/2020 | Rutten | |
| 10,938,404 B1* | 3/2021 | Sanchez | H03M 1/66 |
| 11,228,478 B1* | 1/2022 | Neofytou | H04L 27/366 |
| 11,240,079 B1* | 2/2022 | Kushnir | H04L 27/2602 |
| 2003/0197633 A1* | 10/2003 | Adams | H03M 1/0665 341/144 |
| 2015/0249501 A1* | 9/2015 | Nagarajan | H04B 10/40 398/79 |
| 2016/0211855 A1* | 7/2016 | Unruh | H02M 3/07 |
| 2019/0179791 A1* | 6/2019 | Shokrollahi | G11C 7/1087 |
| 2020/0295976 A1* | 9/2020 | Kobayashi | H04L 25/03038 |

OTHER PUBLICATIONS

Toprak-Deniz Z, Proesel JE, Bulzacchelli JF, Ainspan HA, Dickson TO, Beakes MP, Meghelli M. A 128-GB/s 1.3-pJ/b PAM-4 transmitter with reconfigurable 3-tap FFE in 14-nm CMOS. IEEE Journal of Solid-State Circuits. Sep. 25, 2019;55(1):19-26. pp. 8.

Celik F, Akkaya A, Tajalli A, Leblebici Y. A 32-GB/s PAM-4 SST transmitter with four-tap FFE using high-impedance driver in 28-nm FDSOI. IEEE Transactions on Very Large Scale Integration (VLSI) Systems. Mar. 30, 2021;29 (6):1132-40. IEEE, 2021. pp. 10.

Dickson TO, Deniz ZT, Cochet M, Beukema TJ, Kossel M, Morf T, Choi YH, Francese PA, Brändli M, Baks CW, Proesel JE. A 72-GS/s, 8-Bit DAC-Based Wireline Transmitter in 4-nm FinFET CMOS for 200+ GB/s Serial Links. IEEE Journal of Solid-State Circuits. Dec. 23, 2022;58(4):1074-86. pp. 14.

Stubberud P, Bruce JW. An analysis of dynamic element matching flash digital-to-analog converters. IEEE Transactions on Circuits and Systems II: Analog and Digital Signal Processing. Feb. 2001;48(2):205-13. IEEE, 2001. pp. 10.

Jerry Wayne Bruce, Dynamic element matching techniques for data converters. 1999, pp. 275. Repository Citation Bruce, Jerry Wayne, "Dynamic element matching techniques for data converters" (1999). UNLV Retrospective Theses & Dissertations. 3093. http://dx.doi.org/10.25669/g6sq-mgkf.

European Patent Office. counterpart PCT/EP2023/061869 ISR & WO mailed on Aug. 3, 2023. pp. 14.

* cited by examiner

FIG. 1B
PRIOR ART

MAPPING OF 2b BINARY DATA TO 3b THERMOMETER ENCODED DATA

| BINARY DATA | | THERMOMETER ENCODING | | |
|---|---|---|---|---|
| B<1> | B<0> | T<2> | T<1> | T<0> |
| 0 | 0 | 0 | 0 | 0 |
| 0 | 1 | 0 | 0 | 1 |
| 1 | 0 | 0 | 1 | 1 |
| 1 | 1 | 1 | 1 | 1 |

FIG. 18

TRUTH TABLE FOR 3b BINARY DATA TO 7b THERMOMETER DATA ENCODING

| BINARY DATA | | | THERMOMETER ENCODING | | | | | | |
|---|---|---|---|---|---|---|---|---|---|
| B<2> | B<1> | B<0> | T<6> | T<5> | T<4> | T<3> | T<2> | T<1> | T<0> |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

FIG. 19

3b BINARY DATA TO 7b THERMOMETER
DATA ENCODER - LOGIC FUNCTIONALITY

T<6> = B<2> AND { B<1> AND B<0> }
T<5> = B<2> AND B<1>
T<4> = B<2> AND { B<1> OR B<0> }
T<3> = B<2>
T<2> = B<2> OR { B<1> AND B<0> }
T<1> = B<2> OR B<1>
T<0> = B<2> OR { B<1> OR B<0> }

TRANSMITTER WITH UNIFORM DRIVER SEGMENT ACTIVITY

BACKGROUND

The present invention relates to the electrical, electronic, and computer arts, and more specifically, to transmitters for optical, electronic, and/or opto-electronic communications systems and the like (implemented, for example, in an integrated circuit (IC)).

Referring to FIG. 1A, serial transmitters for 4-level pulse-amplitude modulation (PAM4) data often make use of line driver segments with equal analog weighting. The transmitter includes a network of serializer macros 103-1, 103-2 to perform this serialization (MUX=multiplexer). Before the input data 101 is fully serialized to the output symbol rate, the binary two bit (2 b) data is converted to three bit (3 b) thermometer data in converter 105. In the figure, the serializer macro 103-1, 103-2 serializes from J to K parallel bits (J and K are integers, K<J) and encoder 105 performs the binary-to-thermometer encoding on the two bit K-wide parallel data. Output data from the converter 105 is then further serialized using K:1 serializer macros 111-1, 111-2, 111-3, and output data at the symbol rate ("full-rate") is then applied to the corresponding driver segment 113-1, 113-2, 113-3. The outputs of the driver segments are combined at 115 to obtain serial PAM4 output data.

Still referring to FIG. 1A, DRV0 113-3, DRV1 113-2, and DRV2 113-1 are all equally weighted and nominally (i.e., neglecting mismatch) identical driver segments (also referred to as driver elements). Such an approach improves the relative level mismatch (RLM) as compared to binary weighted drivers. The driver segments can be voltage mode or current mode driver segments. Further, such an approach typically requires the binary input data to be converted to thermometer encoded data for addressing the driver segments. Input parallel data is often DC-balanced (i.e., has an equal number of ones and zeroes). The resulting thermometer encoded data will have different average values and switching activity. In the figure, assuming DC-balanced binary input data, the resulting thermometer-encoded data applied to DRV2 is a logical '1' only 25% of the time; thermometer-encoded data applied to DRV1 is a logical '1' approximately 50% of the time; and thermometer-encoded data applied to DRV0 is a logical '1' approximately 75% of the time. The corresponding driver segments will have different average (DC) current, which has several implications for the driver segments: they will not age evenly; they must be sized for worst-case electromigration, resulting in larger device sizes and parasitics; and they will experience localized temperature mismatch from self-heating. The data transition density of DRV0, DRV1, and DRV2 is also unbalanced, resulting in different dynamic energy consumption between them, which can worsen self-heating gradients. Some or all of these effects resulting from the unbalanced nature of the thermometer encoded data may also be detrimental to circuitry between the binary-to-thermometer encoder and the equally weighted driver elements (for example, K:1 MUX blocks 111-1, 111-2, and 111-3, or any predriver circuitry or data buffers in the data path that are not explicitly depicted in FIG. 1A).

FIG. 1B shows exemplary mapping of 2 b binary data to 3 b thermometer encoded data, as is performed by encoder 105.

Referring to FIG. 2, these problems are exacerbated as the PAM order increases beyond 4 levels. In FIG. 2, note input data 201 (here, J×3 b as opposed to J×2 b in FIG. 1) and output data 215 (here, PAM8 as opposed to PAM4 in FIG. 1). Elements 203-1, 203-2, and 203-3 are analogous to elements 103-1 and 103-2; element 205 is analogous to element 105; elements 211-1, 211-2, 211-3, 211-4, 211-5, 211-6, and 211-7 are analogous to elements 111-1, 111-2, and 111-3; and elements 213-1, 213-2, 213-3, 213-4, 213-5, 213-6, and 213-7 are analogous to elements 113-1, 113-2, and 113-3. Linearity requirements are increased, and driver segment matching and uniform aging and self-heating among the driver segments becomes more important. For example assuming DC-balanced binary input data, switching activity on the highest and lowest thermometer encoded data is further reduced for PAM8 as compared to PAM4. In particular, thermometer-encoded data applied to DRV6 is a logical '1' only approximately 12.5% of the time; thermometer-encoded data applied to DRV5 is a logical '1' approximately 25% of the time; thermometer-encoded data applied to DRV4 is a logical '1' approximately 37.5% of the time; thermometer-encoded data applied to DRV3 is a logical '1' approximately 50% of the time; thermometer-encoded data applied to DRV2 is a logical '1' approximately 62.5% of the time; thermometer-encoded data applied to DRV1 is a logical '1' approximately 75% of the time; and thermometer-encoded data applied to DRV0 is a logical '1' approximately 87.5% of the time Referring now to FIG. 3, DAC-based drivers (DAC=digital-to-analog converter) are common in optics as well as electrical links. It is common to thermometer encode two or more of the DAC most significant bits (MSBs), which advantageously lowers glitching and improves linearity (which is especially important for optics). The activity factor and average current can vary dramatically across the DAC driver MSB elements. Matching among these elements can degrade over time due to different self-heating and aging, resulting in degraded linearity over time, which is problematic for electrical and optical drivers. In FIG. 3, note input data 301 (the M most significant bits) and 397 (the N-M least significant bits (LSBs)).

Elements 303-1 and 303-2 are analogous to elements 103-1 and 103-2; element 305 is analogous to element 105; elements 311-1, 311-2, . . . , 311-$2^M$-1 are analogous to elements 111-1, 111-2, and 111-3; and the individual DAC driver (DRV) MSB elements 395-1, 395-2, . . . , 395-$2^M$-1, within N-bit DAC 399, are analogous to elements 113-1, 113-2, and 113-3. As with 113-1 through 113-3, the $2^M$-1 DAC MSB elements have nominally equal weighting and are addressed with thermometer encoded data. The remaining N-M LSBs 397 of the N-bit DAC remain in binary data format and are applied to the DAC elements 393 contained within N-bit DAC 399, which include elements that apply appropriate analog weighting to this binary data for the purpose of digital-to-analog-conversion. The outputs of the individual DAC driver (DRV) MSB elements 395-1, 395-2, . . . , 395-$2^M$-1 within N-bit DAC 399 and the (N-M) DAC driver (DRV) 393 for the LSBs (also within the N-bit DAC 399) are combined into the transmitter output (TX Output) 391. Note also the K:1 multiplexers 389.

SUMMARY

Principles of the invention provide techniques for a transmitter with uniform segment activity. In one aspect, an exemplary circuit includes at least three equally weighted driver elements; a state variable generator; and an element selector, coupled to the driver elements, and having a first input from the state variable generator, a second input including a plurality of input thermometer-encoded data streams, and an output of an equal number of thermometer-encoded output data streams supplied to the equally weighted driver elements. The element selector is configured such that a mapping of the second input to the output is dynamically assigned based on a value of the first input from the state variable generator, with an update rate that is no more than one half of a symbol-rate. Also included is a serializer operatively associated with the at least three equally weighted driver elements and the element selector. The serializer is configured to provide serialized data at the symbol rate, with output of the serializer coupled to one of the second input of the element selector and input of the at least three equally weighted driver elements. The at least three equally weighted driver elements have outputs that are combined to produce an output of the circuit at the symbol rate.

In another aspect, a hardware description language (HDL) design structure is encoded on a machine-readable data storage medium, and the HDL design structure includes elements that when processed in a computer-aided design system generates a machine-executable representation of an apparatus/circuit. The HDL design structure includes a circuit as just described.

In still another aspect, an exemplary method includes, with an element selector, coupled to at least three equally weighted driver elements, obtaining a first input from a state variable generator, and a second input including a plurality of input thermometer-encoded data streams; with the element selector, outputting of an equal number of thermometer-encoded output data streams to the equally weighted driver elements; with the element selector, dynamically mapping the second input to the output based on a value of the first input from the state variable generator, with an update rate that is no more than one half of a symbol-rate; with a serializer operatively associated with the at least three equally weighted driver elements and the element selector, providing serialized data at the symbol-rate, with output of the serializer coupled to one of the second input of the element selector and input of the at least three equally weighted driver elements; and combining outputs of the at least three equally weighted driver elements to produce an output of the circuit at the symbol rate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in hardware such as digital circuitry. Some aspects (e.g., design process/design structures of FIG. 16) can be implemented in the form of a computer program product including a computer readable storage medium with computer usable program code for performing the method steps indicated/describing circuit(s) as disclosed. The software can then be executed on a system (or apparatus) including a memory, and at least one processor that is coupled to the memory.

Techniques of the present invention can provide substantial beneficial technical effects. For example, one or more embodiments provide:

ability to dynamically assign thermometer encoded data to respective thermometer encoded DAC elements at an update rate that is a fraction of the DAC symbol rate, to save power;

improve evenness of aging;

reduced device size and reduced parasitics due to reducing or eliminating need to design for worst-case electromigration;

improved thermal uniformity; and/or reduced or eliminated degradation in linearity over time.

These and other features and advantages of the present invention will become apparent from the following detailed description of illustrative embodiments thereof, which is to be read in connection with the accompanying drawings.

BRIEF DESCRIPTION OF THE DRAWINGS

FIG. 1B shows exemplary mapping of 2 b binary data to 3 b thermometer encoded data, as known from the prior art;

FIG. 18 is a truth table for 3 b binary data to 7 b thermometer data encoding, according to aspects of the invention;

FIG. 19 is logic for 3 b binary data to 7 b thermometer data encoding, according to aspects of the invention.

DETAILED DESCRIPTION

Figure 1A:
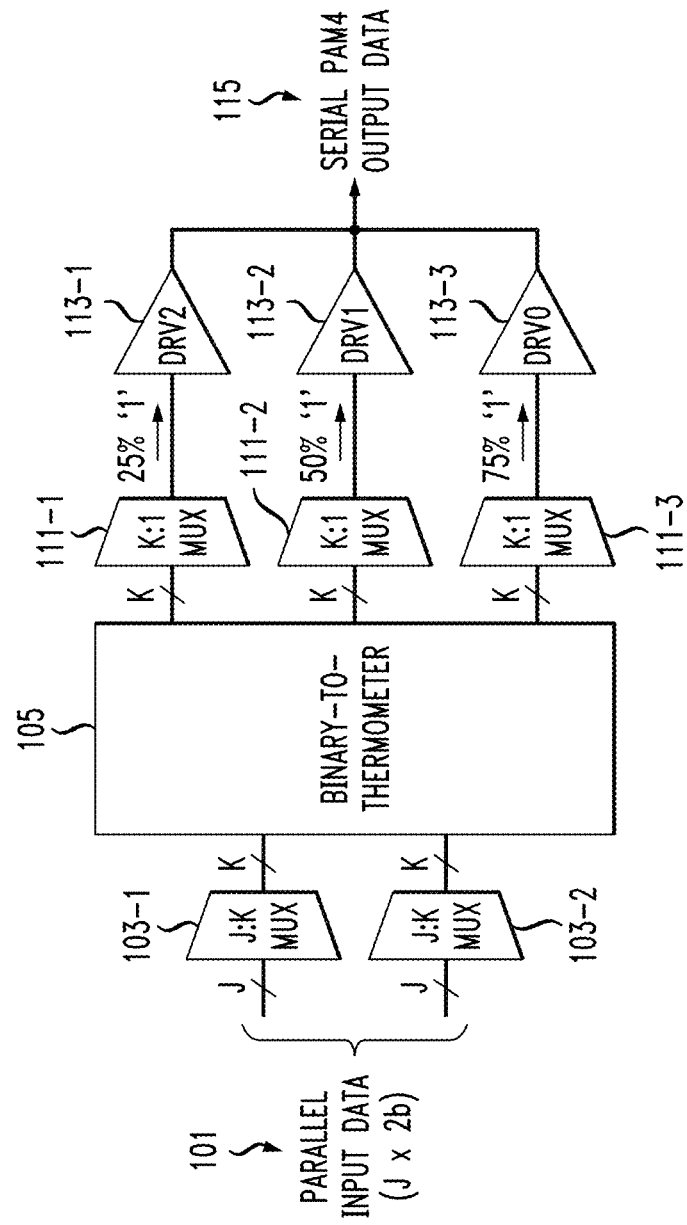
FIG. 1A depicts a serial transmitter for 4-level pulse-amplitude modulation (PAM4) data, as known from the prior art.
Figure 2:
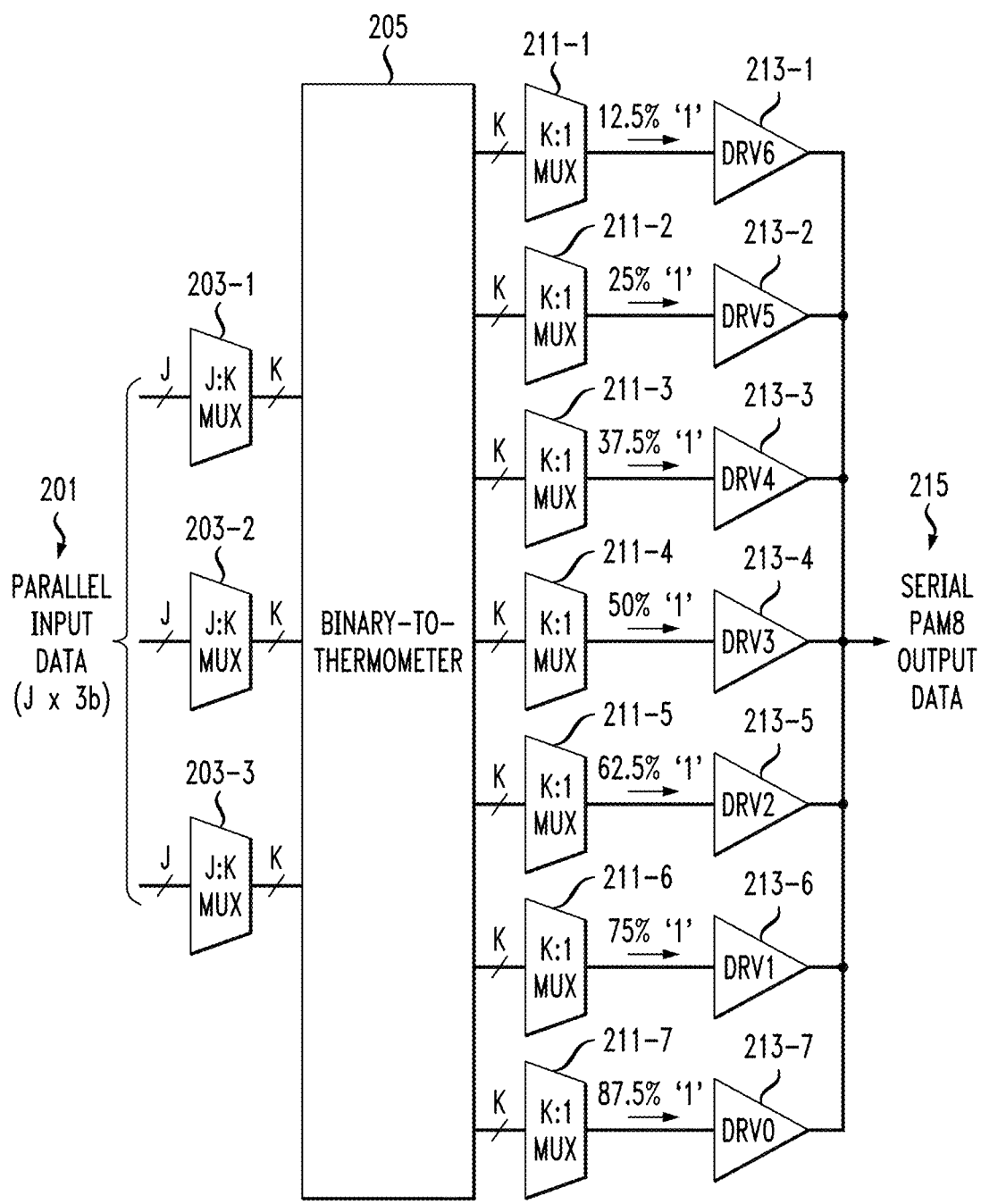
FIG. 2 depicts a serial transmitter for 8-level pulse-amplitude modulation (PAM8) data, as known from the prior art.

Serial links operating at data rates at or above 56 Gbps commonly employ advanced modulation schemes such as 4-level pulse amplitude modulation (PAM4) (one or more embodiments are applicable to PAM4 or higher). Transmitters to implement this modulation scheme often make use of digital-to-analog converters (DACs). The DACs may take the form of a coarse 2 b (4-level) DAC to implement the 4-level PAM modulation. The TX (TX=transmitter) architecture can combine this DAC with feed-forward equalization techniques implemented using custom high-speed logic (or perhaps even analog techniques) within the transmitter. In more complex transmitters, where the modulation, and any equalization, are implemented using digital signal processing (DSP), the DAC can be higher resolution (typically 6 to 8 bits). In all of these scenarios, it is common for the DAC to employ a segmented architecture, wherein a certain number of the DAC elements with weighting associated with two or more of the most significant bits (MSBs) are implemented using thermometer encoding techniques. For example, as shown and discussed with regard to FIG. 1A, in a simple 2 b (two bit) DAC to implement PAM4 modulation, the 2 b DAC could be implemented using three identical DAC elements. This is well understood to reduce glitches at the DAC output, and to improve DAC linearity (in particular, it reduces the differential nonlinearity or DNL) as needed for acceptable relative level mismatch (RLM) in PAM4 transmitters. Binary-to-thermometer (or unary) encoding is typically needed to convert 2 b binary data to 3 b (three bit) thermometer-encoded data. For similar reasons, in higher resolution 6-8 b (six- to eight-bit) DACs, it is common for the DAC elements associated with a few MSBs (typically two or three MSBs) to be implemented with equally weighted elements (or segments) that are asserted with thermometer encoded data.

The above can be extended to higher-order modulation schemes, which typically increase the required DAC resolution. For example, 8-level pulse amplitude modulation (PAM8) requires at least a 3 b (8-level) DAC, as compared to a minimum 2 b DAC for PAM4. In systems where modulation and equalization functionalities are implemented using DSP, a higher resolution DAC is still typically required. Frequency domain modulation formats such as orthogonal frequency domain modulation (OFDM) typically require Fourier transforms implemented in DSP, along with a DAC resolution of 7 b (seven bits) or higher.

In systems employing data modulation formats such as 4-level pulse amplitude modulation (PAM4) or orthogonal frequency division multiplexing, the thermometer encoded MSB data can exhibit a DC-imbalance on certain bits, and can have transition densities less than 50%. As an example, in a PAM4 transmitter where the two MSBs are encoded to a 3 b thermometer encoding, the upper thermometer encoded bit conducts a logic zero approximately 75% of the time and the lower thermometer encoded bit conducts a logic one approximately 75% of the time, while the middle thermometer encoded bit receives DC-balanced data. The situation is exacerbated in the case of orthogonal frequency-division multiplexing (OFDM) modulation with a 6 dB peak-to-average ratio, where the upper thermometer encoded bit conducts a logic zero approximately 98% of the time. This DC imbalance can degrade the performance of a high speed DAC due to several factors. From a design perspective in modern semiconductor technologies, the higher DC current levels require wider passive and active devices to reliably conduct the resulting higher average current, and wider metal interconnects to deliver this higher DC current to and from the active and passive devices, while avoiding long-term degradation due to electromigration (note that in one or more exemplary embodiments, the active devices in the driver are the ones delivering the current; however, other driver implementation scenarios can be employed in other embodiments). These larger devices and interconnects have higher parasitic capacitances associated with them, which can degrade the high-frequency DAC performance. Differences in DC currents between DAC elements can also result in temperature differences between these elements, which over time will degrade component matching as well as DAC linearity. Finally, the difference in DC currents and switching activity factors between different DAC elements can cause some elements to age faster than others, which will degrade DAC performance over time. Those imbalances and their consequences can apply both to the final stage driver but also to all the other stages after the binary to thermometer encoder.

Dynamic element matching is a technique that has been widely used for decades in high-resolution DACs, commonly in multi-bit DACs employed in the feedback path of delta-sigma modulators (see, e.g., L. Richard Carley, *A Noise-Shaping Coder Topology for* 15+ *Bit Converters*, IEEE Journal of Solid-State Circuits, Volume 24, Number 2, Apr. 1989 pages 267-273)(hereinafter, "Carley"). This technique uses a DAC where some or all of the bits are thermometer encoded, and randomizes the assertion of these elements as the DAC input digital code is updated. The goal of such a technique is to reduce harmonic distortion due to DAC integral non-linearity, by spreading power associated with DAC distortion tones over a wide frequency range. For this technique to be most effective, the randomized selection should be done each time the DAC is addressed (i.e., at the DAC output symbol rate). Timing constraints to enable glitch-free element selection in DACs with sampling rates of tens of giga-samples per second may be prohibitive. Moreover, linearity requirements for most wireline DACs with resolutions in the range of 6-8 bits usually do not warrant the added power and complexity to perform randomized element selection this often.

One or more embodiments provide a wireline transmitter system involving a driver with some or all driver segments (or elements) addressed (or selected) via thermometer-encoded data. Instead of static assignment of the thermometer-encoded data to driver elements, the thermometer-encoded data is dynamically assigned to the driver elements. This dynamic assignment is updated through an 'element selection' circuit, which has input-to-output mapping that is governed by a state variable. This state can be updated at a much lower rate that what is done in conventional dynamic element matching. For example, to mitigate self-heating time constants, the state need only be updated perhaps once every nanosecond. For a transmitter operating at 28 GBaud (billions of symbols per second) or higher, this represents an update rate more than an order of magnitude lower than what is typically done for conventional dynamic element matching. Unlike dynamic element matching, the state can be updated in a deterministic fashion, based on the data history, so long as the output thermometer encoded data is DC-balanced over some acceptable period of time.

Figure 4A:
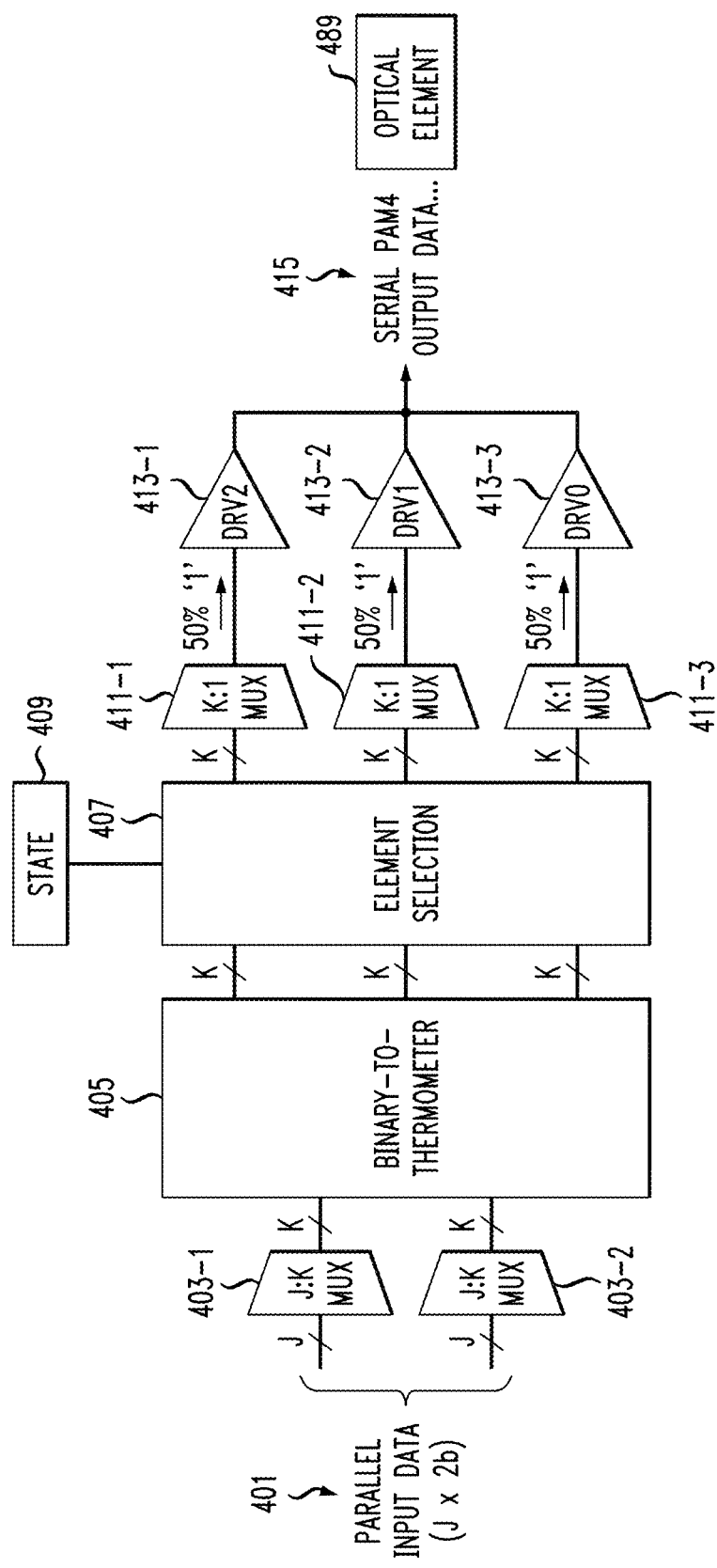
FIG. 4A shows an exemplary PAM4 transmitter, according to an aspect of the invention.

FIG. 4A illustrates one exemplary embodiment of the present invention, involving a simple PAM4 wireline transmitter system without feed-forward equalization (FFE). The output 4-level symbols are generated via a 2 b DAC which is implemented using three identically weighted driver segments DRV0, DRV1, and DRV2 addressed with three thermometer-encoded bits. The three driver outputs are combined at a single output node. Aspects of the present invention can be applied to any driver topology, including, but not limited to, a current-mode logic (CML) driver or a voltage mode driver (e.g., a source-series terminated (SST) driver). Moreover, as the transmitter output is connected to one or more I/O pads (omitted to avoid clutter), it is understood that the transmitter may require additional output matching resistors and/or ESD (electrostatic discharge) protection devices, which may further require bandwidth extension elements such as a T-coil. Note that optics to drive, e.g., a vertical cavity surface emitting laser (VCSEL) may have one output pad, but electrical TX usually have differential outputs.

The transmitter system receives 2 b parallel data to be serialized and modulated as a 4-level PAM signal. In the diagram, the width of the parallel data 401 is denoted as J. The transmitter includes a network of serializer macros 403-1, 403-2 to perform this serialization (MUX=multiplexer). Before the data is fully serialized to the output symbol rate, the binary 2 b data is converted to 3 b thermometer data in converter 405. The exact location within the serializer chain for this binary-to-thermometer converter is a design consideration that should factor in serializer timing margins as well as additional power and area required to serialize 3 b thermometer encoded data as opposed to 2 b binary data. In the figure, the serializer macro 403-1, 403-2 serializes from J to K parallel bits (J and K are integers, K<J) and encoder 405 performs the binary-to-thermometer encoding on the two bit K-wide parallel data. After thermometer encoding, each data stream of the 3 b data can then be dynamically assigned to one of the three equally weighted driver segments 413-1, 413-2, 413-3.

This dynamic assignment is controlled through the macro 407 labeled 'Element Selection.' Input-to-output mapping of the element selection macro is controlled through a state variable generated by a state variable generator (STATE) 409. Output data from the element selection macro 407 is then further serialized using K:1 serializer macros 411-1, 411-2, 411-3, and output data at the symbol rate ("full-rate") is then applied to the corresponding driver segment 413-1, 413-2, 413-3. Some or all of the K:1 serialization functionality can also be embedded directly in the driver circuitry, as would be understood by one skilled in the art. The serial PAM4 output data is shown at 415. A pertinent advantage of the exemplary architecture lies in the statistics of the data applied to each of the DRV elements. In prior art (static assignment) of thermometer-encoded data to DRV segments, well-balanced (i.e., long-term average of 50% logic 'one' and 50% logic 'zero') binary data can result in thermometer-encoded data that is not well balanced, as mentioned earlier. In one or more embodiments of the present invention, regular updating of the state variable 409 results in well-balanced data being applied to each of the drivers. It is understood that J:K MUX circuitry 403-1 and 403-2 may be omitted, as may K:1 MUX circuitry 411-1, 411-2, and 411-3, in certain implementations.

Figure 4B:
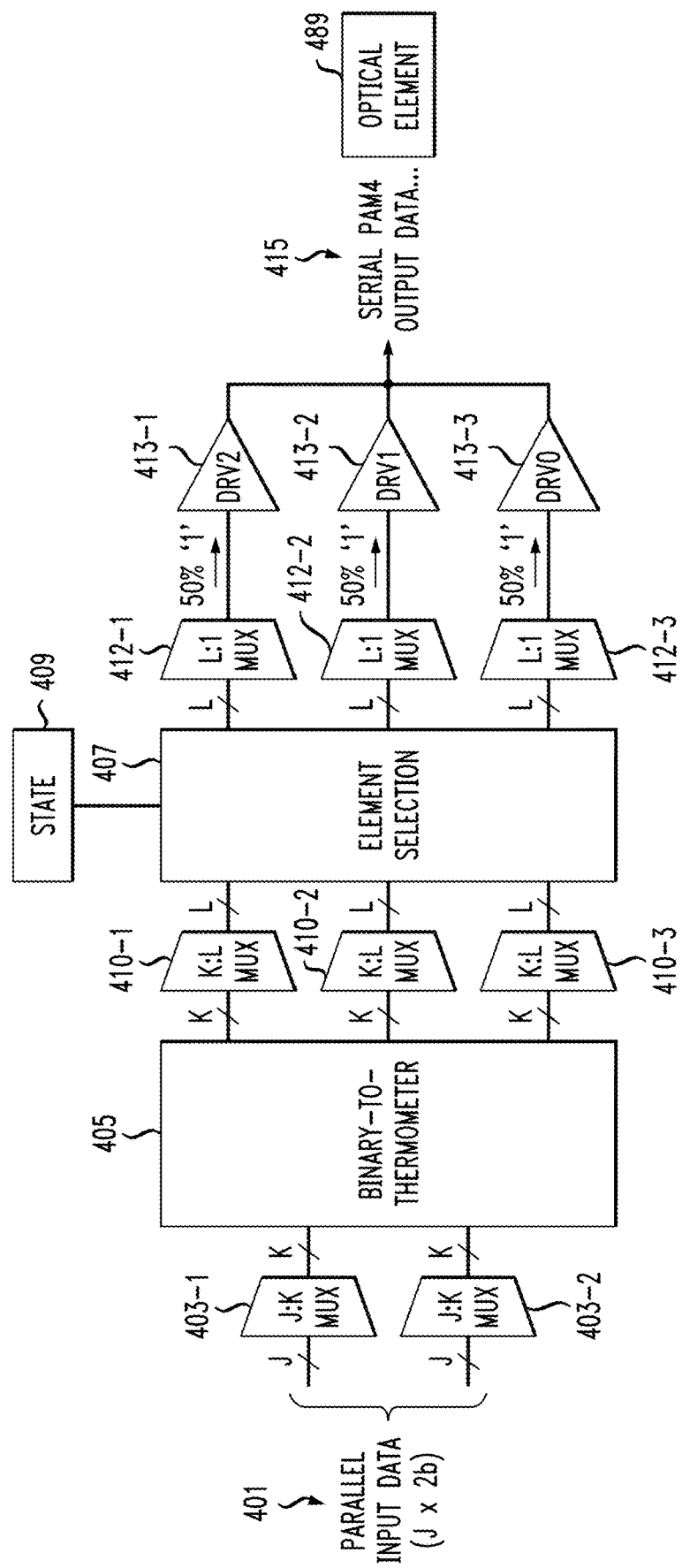
FIG. 4B shows another exemplary PAM4 transmitter, according to an aspect of the invention.

FIG. 4B shows a variation on the exemplary embodiment of FIG. 4A, wherein similar elements have received the same reference number. In general, it is possible to insert another multiplexer or serializer between the binary-to-thermometer encoder and the element selection blocks; in FIG. 4B, note the K:L multiplexers 410-1, 410-2, 410-3. The multiplexers 412-1, 412-2, 412-3 downstream of the element selection block 407 are L:1 multiplexers. In some circumstances, the J:K MUX 403-1, 403-2 could be eliminated. In other circumstances, the L:1 MUX 412-1, 412-2, and 412-3 could be eliminated. In one or more embodiments, J, K, and L are integers, and J>K>L, and L is greater than or equal to 1.

Figure 5:
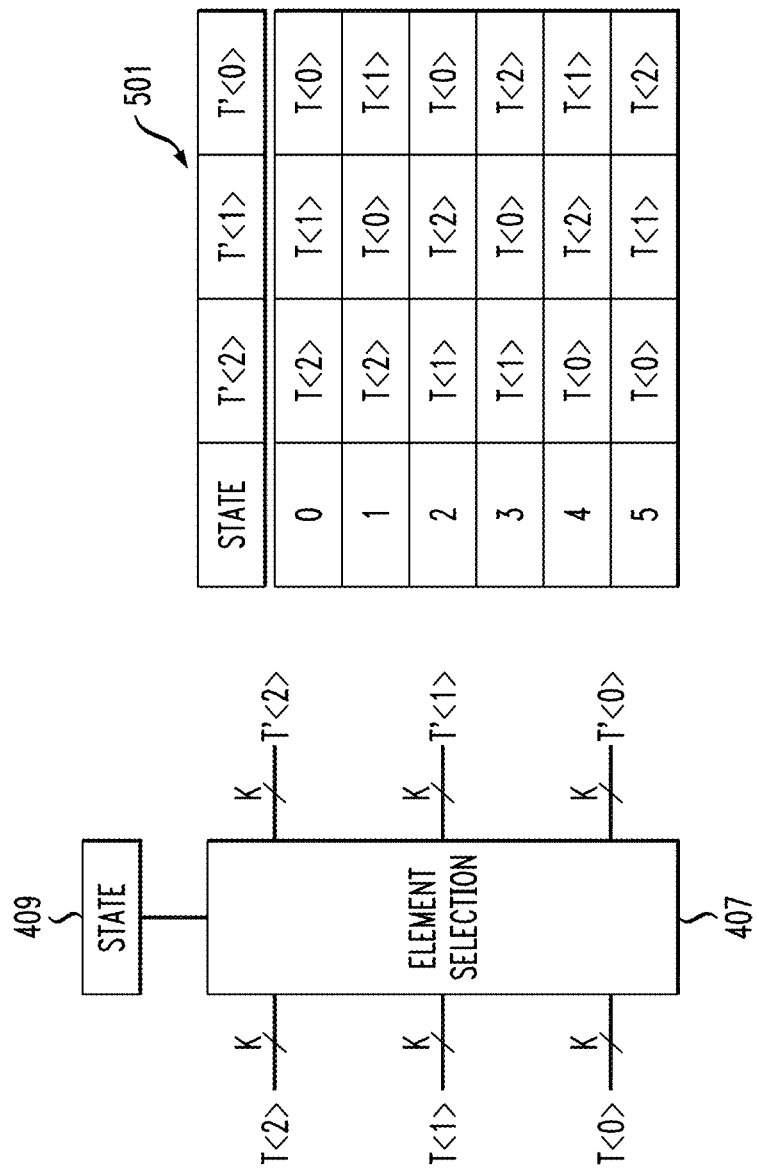
FIG. 5 shows exemplary element selection with three thermometer encoded bits, according to an aspect of the invention.

FIG. 5 shows an example of element selection for addressing a TX driver with 3 b thermometer-encoded data. The element selection permits input data T<0>, T<1>, and T<2>to be routed to outputs T'<0>, T'<1>, and T'<2>, depending on an internal state variable that can be updated randomly, pseudo-randomly, or deterministically, depending on data history. In particular, FIG. 5 shows an example of an element selection macro for a TX system where 3 b thermometer encoded data is used to address three equally weighted driver segments. The element selection macro receives parallel input thermometer encoded input data T<2>, T<1>, and T<0> (each K-wide) and produces output data T'<2>, T'<1>, and T'<0>(each still K-wide). The internal state variable 409 governs the input-to-output assignment as described in the table 501. As noted, this state variable can be updated randomly or pseudo-randomly through a state machine. Unlike dynamic element matching, this state variable could also be updated in a deterministic fashion depending on state and input data history in an attempt to achieve long-term DC balancing of the output data T'<2>, T'<1>, and T'<0>. The table 501 illustrates, for exemplary purposes, how the inputs are routed to the outputs depending on the state of the state variable.

Figure 6A:
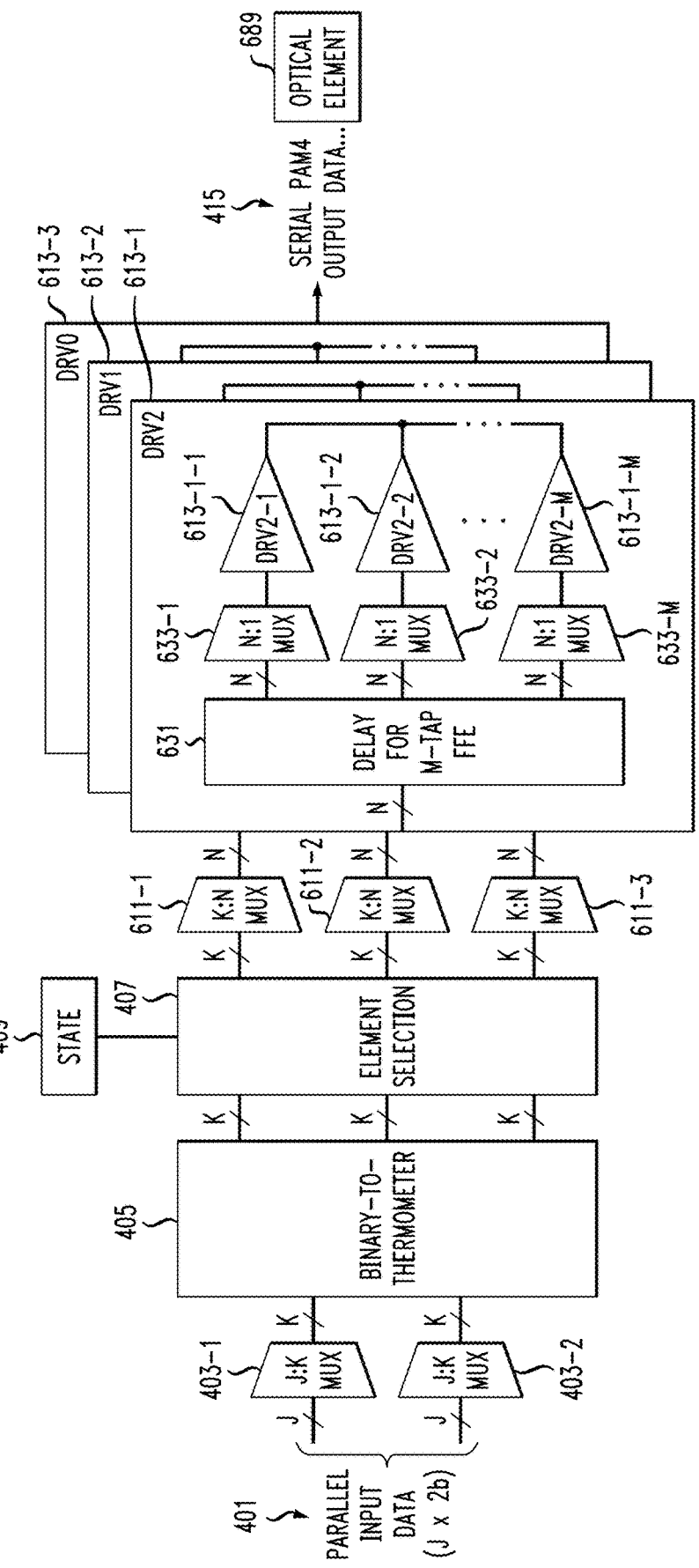
FIG. 6A shows an exemplary PAM4 transmitter with feed forward equalization (FFE), according to an aspect of the invention.

Another exemplary embodiment of the present invention is depicted in FIG. 6A, which depicts a 4-level PAM transmitter with feed-forward equalization (FFE). Elements analogous to those in FIG. 4A have received the same reference character. This embodiment extends the architecture from FIG. 4A to include an M-tap feed forward equalization (FFE) scheme (M is an integer). In this embodiment, each of the equally weighted driver elements DRV0 613-3, DRV1 613-2, and DRV2 613-1, are subdivided into M smaller sub-driver elements. For example, DRV2 613-1 is subdivided into DRV2-1 through DRV2-M numbered 613-1-1, 613-1-2, . . . 613-1-M. These sub-driver elements are used to implement FFE wave shaping at the output of the transmitter. Each of the sub-driver elements is associated with one of the M taps in the feedforward equalizer, and its weighting will depend on the required FFE tap weights (or FFE coefficients) required for equalizing frequency-dependent loss. As such, the weighting of each of DRV2-1 through DRV2-M does not need to be equal and may be adaptable. However, each sub-driver in DRV2 should have equal weighting to the corresponding sub-drivers in DRV1 and DRV0, such that the sum of all the sub-driver weights in DRV2, DRV1, and DRV0 are all equal. Stated in a different way, within a driver 613-1, 613-2, 613-3, the sub-drivers can have different weights from each other (for example, to implement the FFE coefficients); however, between drivers 613-1, 613-2, 613-3, the first sub-driver in 613-1 should have the same weight as the first sub-driver in 613-2 and the first sub-driver in 613-3, . . . , and the $M^{th}$ sub-driver in 613-1 should have the same weight as the $M^{th}$ sub-driver in 613-2 and the $M^{th}$ sub-driver in 613-3. The 3 b thermometer-encoded data is dynamically assigned to DRV segments via the Element Selection macro 407, similar to the system without FFE from the embodiment of FIG. 4A. Each of the three DRV driver elements 613-1, 613-2, 613-3 includes a delay generation mechanism 631 as required for an M-tap FFE. This delay generation block produces M parallel output data that replicates the input data, but delayed at regular time intervals as is needed for finite impulse response (FIR) filtering. The delay interval is commonly equal to the transmitter symbol period, but in some applications may be less than the symbol period (e.g., half of the symbol period) in order to produce a higher frequency FIR filter response. Delayed versions of the data are then sent to respective N:1 MUX macros 633-1, 633-2, . . . , 633-M for further serialization. Therefore, the K:1 serialization function from the embodiment of FIG. 4A is now distributed across K:N MUX and N:1 MUX macros in the embodiment of FIG. 6A (N and K are integers, with N<K. In some embodiments, it is conceivable that N=1). It is again understood that some or all of the MUX circuitry may be omitted in certain implementations; for example the J:K MUX circuitry 403-1 and 403-2, the K:N MUX circuitry 611-1, 611-2, and 611-3, and the N:1 MUX circuitry 633-1, 633-2, . . . , 633-M.

Figure 6B:
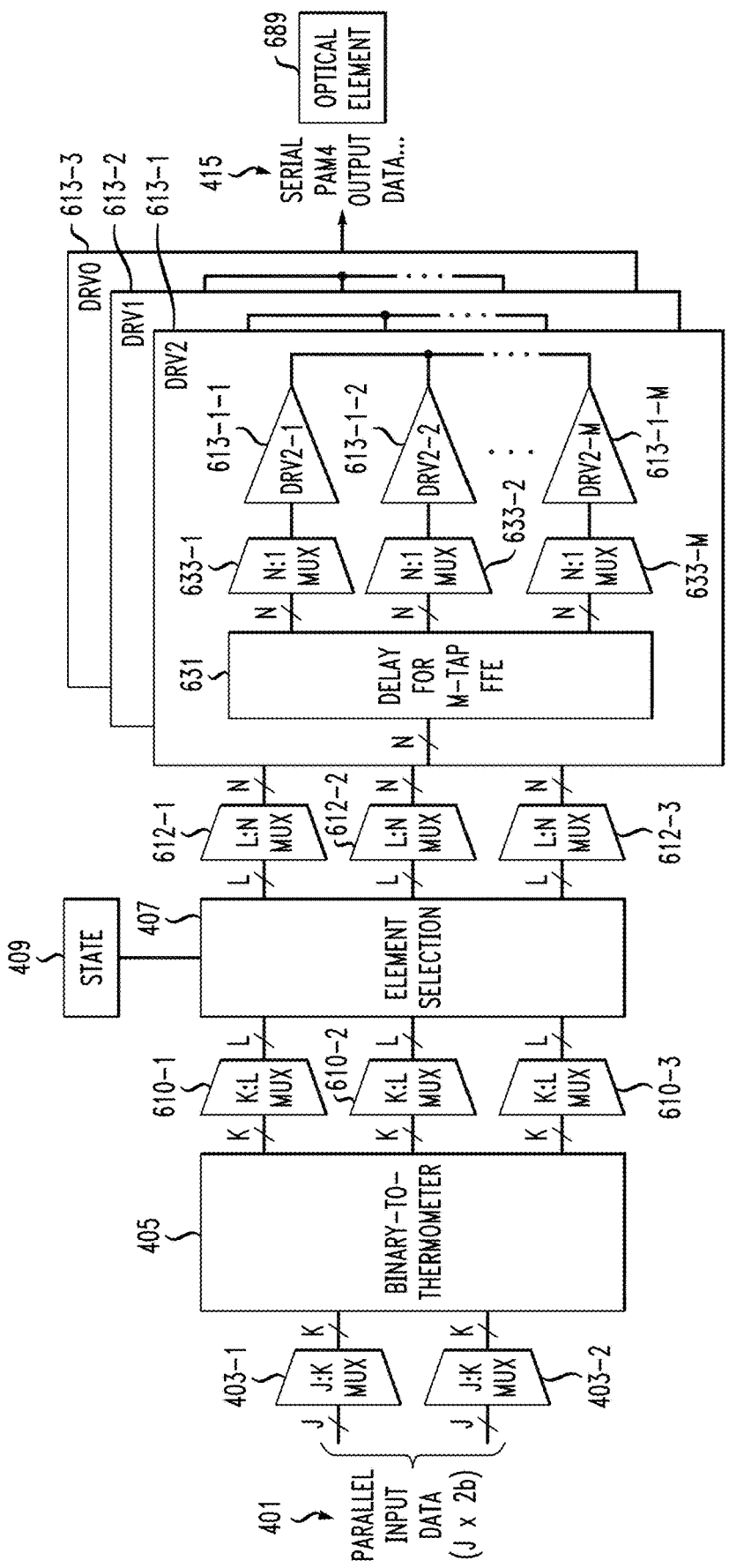
FIG. 6B shows another exemplary PAM4 transmitter with feed forward equalization (FFE), according to an aspect of the invention.

FIG. 6B shows a variation on the exemplary embodiment of FIG. 6A, wherein similar elements have received the same reference number. In general, it is possible to insert another multiplexer or serializer between the binary-to-thermometer encoder and the element selection blocks; in FIG. 6B, note the K:L multiplexers 610-1, 610-2, 610-3. The multiplexers 612-1, 612-2, 612-3 downstream of the element selection block 407 are L:N multiplexers. In one or more embodiments, J, K, and L are integers, and J>K>L>N, N is greater than or equal to 1.

Figure 7A:
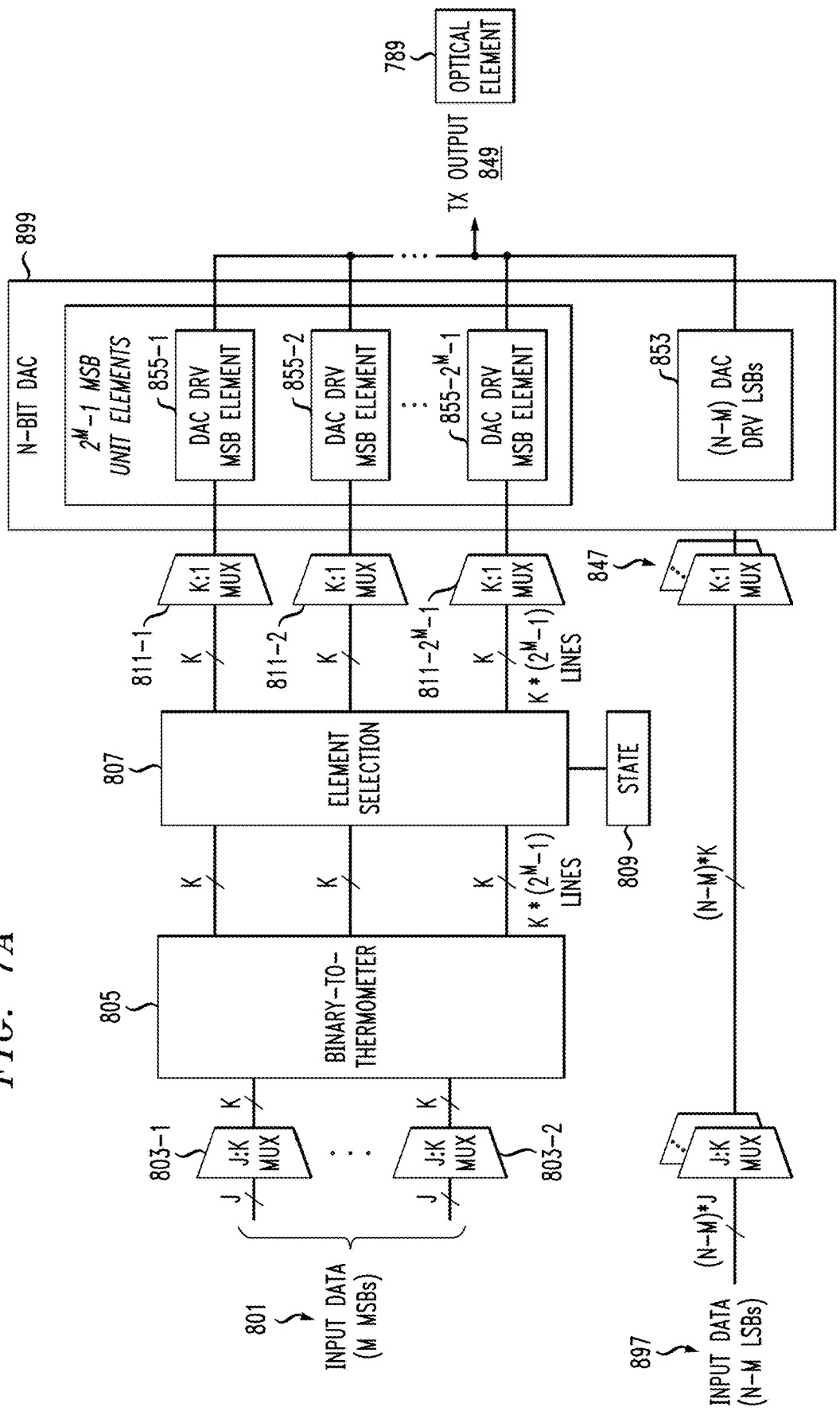
FIG. 7A shows an exemplary transmitter with a segmented N-bit DAC driver, according to an aspect of the invention.

FIG. 7A shows an exemplary high-speed DAC with data serialization and element selection of the thermometer encoded DAC unit elements. In particular, FIG. 7A presents yet another embodiment of the present invention applied to a wireline TX based on an N-bit DAC output driver 899. In the N-bit DAC, the upper M number of MSBs 801 are to be thermometer-encoded in encoder 805 in order to address $2^M-1$ equally weighted DAC driver (DRV) MSB elements 855-1, 855-2, . . . , 855-$2^M$-1. In the figure, the serializer macro 803-1, 803-2 serializes from J to K parallel bits (J and K are integers, K<J) and encoder 805 performs the binary-to-thermometer encoding on the two bit K-wide parallel data. The remaining N-M LSBs 897 of the DAC may be implemented in binary-weighted fashion. Note that N and M are again integers, and are not related to the N and M values associated with the architecture of FIG. 6A. At some point in the TX system serializer chain (e.g., in encoder 805), the upper M MSBs 801 are thermometer-encoded to $2^M-1$ bits, after which the element selection macro 807 controlled by STATE 809 dynamically assigns these $2^M-1$ bits to the $2^M-1$ DAC DRV MSB elements 855-1, 855-2, . . . , 855-$2^M$-1 contained within the N-bit DAC 899. After dynamic assignment, the K-wide parallel thermometer encoded data streams are further serialized to the symbol rate in MUX elements 811-1, 811-2, . . . , 811-$2^M$-1 before addressing their respective DAC elements. Depending on the DAC DRV MSB element topology, it is understood that some portion of the K:1 multiplexing may be embedded or merged within the respective DAC DRV MSB elements contained within 899, as would be understood by one skilled in the art. In the example of FIG. 7A, the remaining N-M LSBs 897 of the N-bit DAC remain in binary data format and are applied to the DAC elements 853 contained within N-bit DAC 899, which include elements that apply appropriate analog weighting to this binary data for the purpose of digital-to-analog-conversion. The outputs of the individual DAC driver (DRV) MSB elements 855-1, 855-2, . . . , 855-$2^M$-1 within N-bit DAC 899 and the (N-M) DAC driver (DRV) 853 for the LSBs (also within the N-bit DAC 899) are combined into the transmitter output (TX Output) 849. Note also the K:1 multiplexers 847.

Figure 7B:
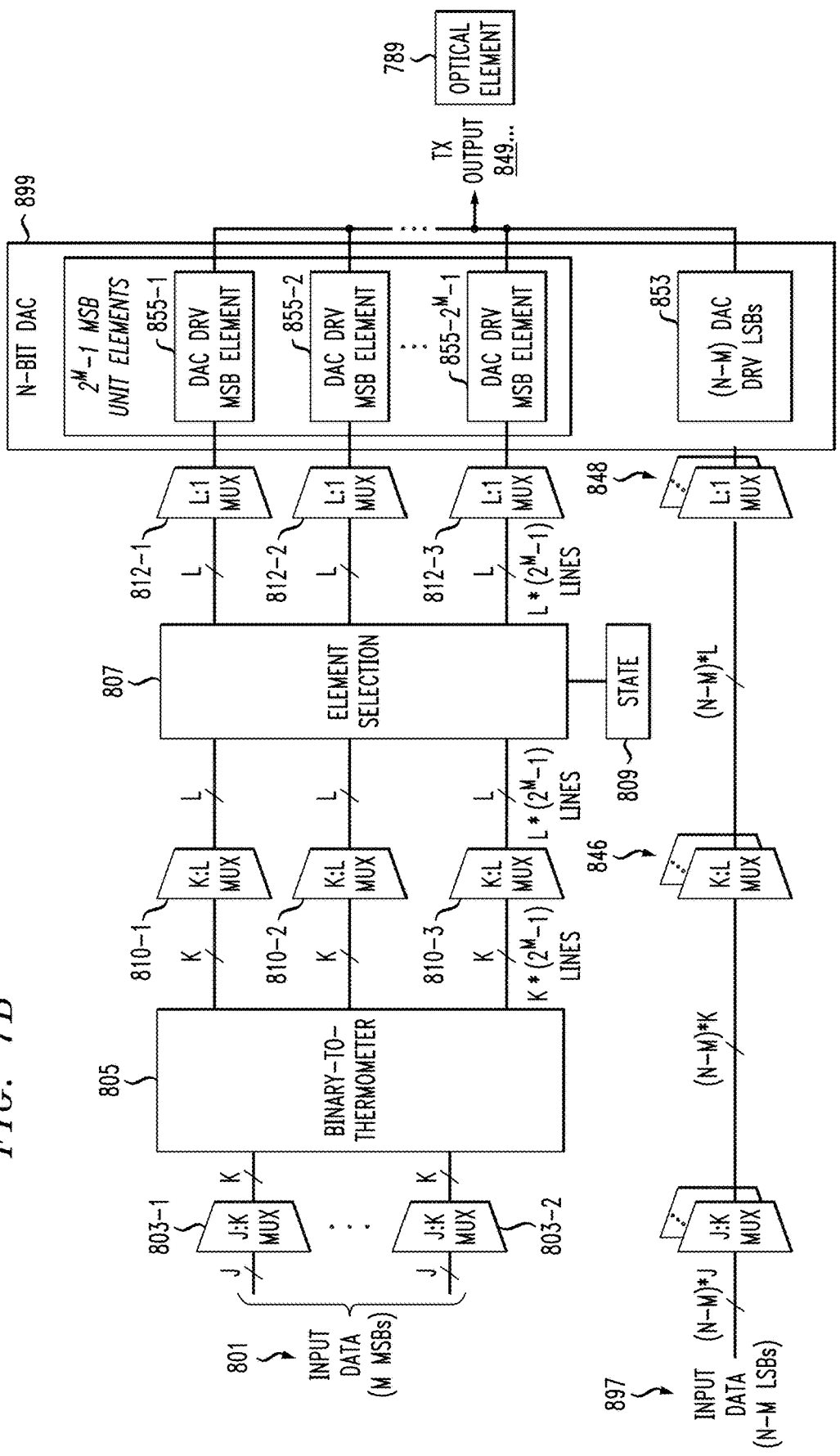
FIG. 7B shows another exemplary transmitter with a segmented N-bit DAC driver, according to an aspect of the invention.

FIG. 7B shows a variation on the exemplary embodiment of FIG. 7A, wherein similar elements have received the same reference number. In general, it is possible to insert another serializer between the binary-to-thermometer encoder and the element selection blocks; in FIG. 7B, note the K:L multiplexers 810-1, 810-2, 810-3. The multiplexers 812-1, 812-2, 812-3 downstream of the element selection block 807 are L:1 multiplexers. In one or more embodiments, J, K, and L are integers, with J>K>L, and L greater than or equal to 1.

Figure 8:
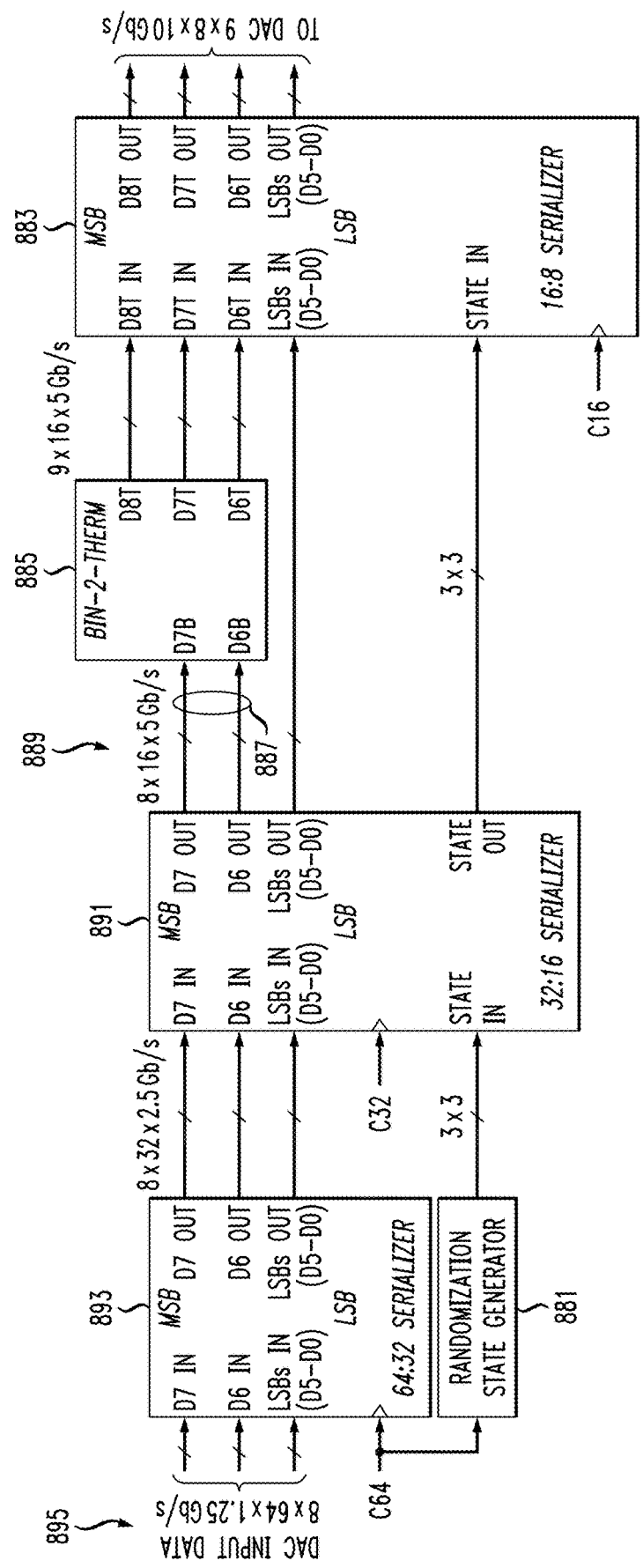
FIG. 8 shows an exemplary 64:8 serializer for 8 b DAC, according to an aspect of the invention.

A further embodiment of a serializer macro with embedded binary-to-thermometer encoding and element selection macro is depicted in FIG. 8; in particular, an example serializer embodiment, with a 64:8 serializer architecture including element selection for an 8 b DAC. FIG. 8 is an exemplary embodiment of elements 803-1, 803-2, 805, 807, and partially 811-1 through 811-$2^M$-1. In this context, J=64, K=16. FIG. 8 also includes a 16:8 MUX (i.e., a portion of the K:1 MUX of FIG. 7A). The upper two DAC MSBs (i.e., M=2, referring to FIG. 7A) are thermometer encoded. FIG. 8 depicts only the 64:8 serializer macro used in an 80 GS/s DAC that would be used in an 80 GBaud wireline transmitter. It is understood that the output data from this 64:8 serializer is sent to another macro to perform further 8:1 serialization and 8 b digital-to-analog conversion. Furthermore, the 8 b DAC architecture is such that the upper two bits of the DAC are to be thermometer encoded. In FIG. 8, the 64-wide 8 b input data 895 is processed to a 64:32 serializer 893 followed by a 32:16 serializer 891 to produce 16-wide 8 b data 889 toggling at a rate 4x (i.e., four times) faster than the input data. At this point, the upper two 16-wide MSBs 887 of the data 889 are thermometer encoded using a 2-bit binary to 3-bit thermometer encoder 885. Element selection for the purpose of DC-balancing this thermometer encoded data is accomplished inside the 16:8 serializer macro 883, as will be described shortly. The architecture of FIG. 8 also includes a randomized state variable generator 881 that is updated every C64 clock cycle (1/64$^{th}$ of the output DAC symbol rate, corresponding to a 1.25 GHz update frequency for an 80 GS/s DAC). For robust timing, the state variable is retimed at the C32 clock rate (2.5 GHz) such that it is synchronized with data 889 before being applied to the 16:8 serializer macro 883. Regarding encoder 885, non-limiting examples of binary-to-thermometer encoders are presented elsewhere herein.

Figure 9:
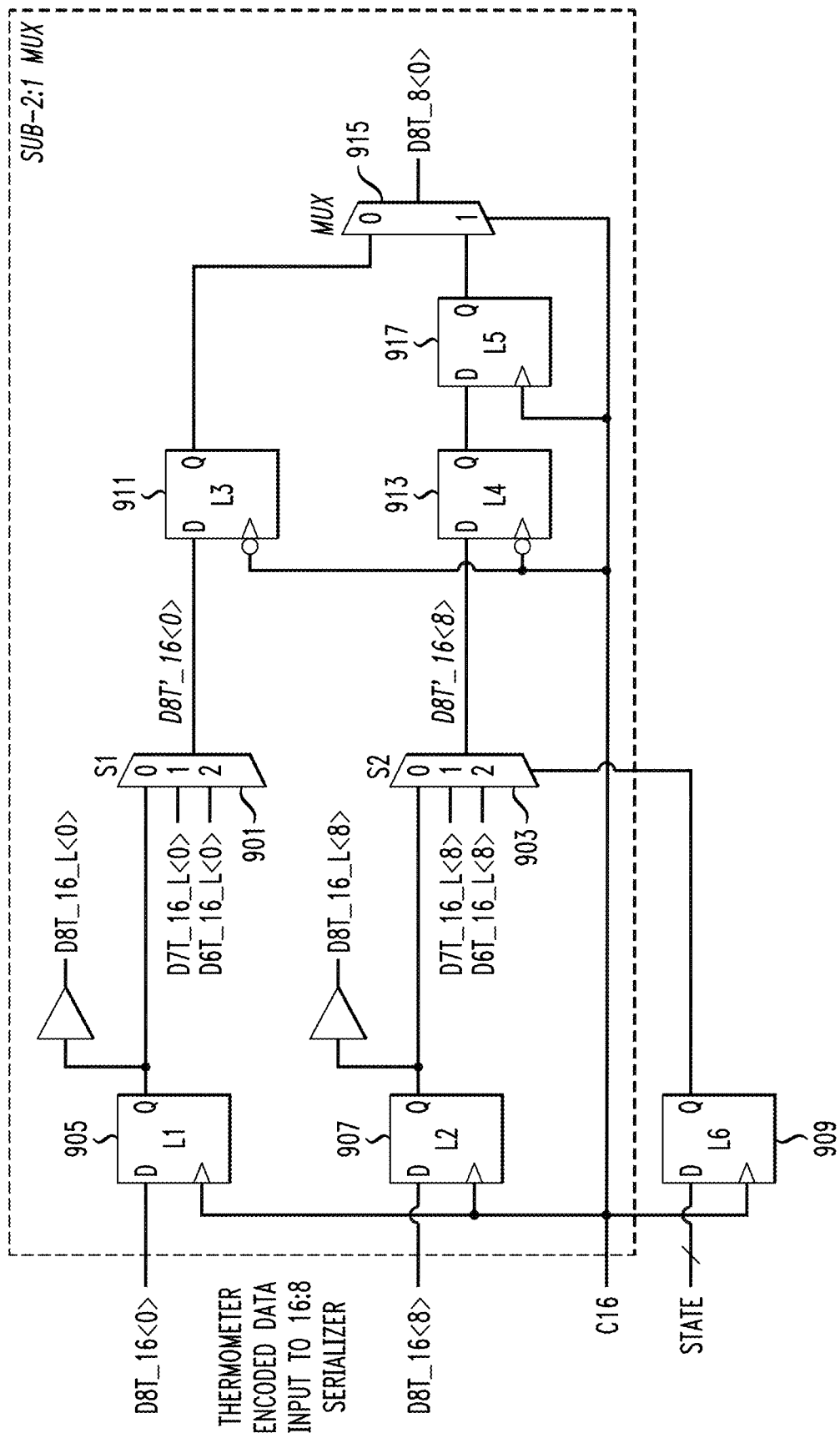
FIG. 9 shows an exemplary 16:8 serializer with randomization, according to an aspect of the invention.

The 16:8 serializer 883 includes several sub-2:1 MUX blocks to serialize individual bits of data. FIG. 9 shows an exemplary sub-2:1 MUX block for MSB data bits; in particular, an illustration of a sub 2:1 multiplexer block within the 16:8 serializer 883 of FIG. 8, with element selection circuitry S1 901 and S2 903. Input data bits D8T_16<0> and D8T_16<8> from the 32:16 serializer are pulled into the C16 clock domain through capture latches L1 905 and L2 907 respectively. After these latches, selectors S1 and S2 perform the role of element selection. These selectors receive not only latched data corresponding to D8T, but also for other thermometer encoded MSB data bits D7T and D6T derived from respective L1 or L2 latches in their corresponding sub-2:1 MUX blocks (not shown). A state variable STATE from the randomized state generator of FIG. 8 is also retimed to the C16 domain by L6 latches 909, and subsequently serves as the select signal for selectors S1 and S2. Based on this select state, the respective output data bits D8T' (i.e., D8T'_16<0> and D8T'_16<8>) are determined through selection of one of data bits D8T_16_L, D7T_16_L, or D6T_16_L. Retiming of the state variable and input data to the C16 clock edges allows for robust timing and ensures glitch-free selection of the data. Output data from the selectors S1 and S2 are then captured on the falling edge of clock C16 by latches L3 911 and L4 913 before ultimately being multiplexed via MUX 915 to 8$^{th}$ date data D8T 8<0>. Output data from latch L4 913 is further delayed by one-half of a C16 clock period by latch L5 917 and then input to MUX 915. The additional delay through this path improves timing margins associated with MUX 915. FIG. 9 thus depicts a modification of a standard 5-latch serializer, including a string of latches to delay one path with respect to the other, for purposes of timing margins. A MUX 915 ping-pongs back and forth between the two paths. The circuit of FIG. 9 takes a state variable STATE (random or deterministic) and re-times it so that it is possible to proceed in a glitch-free fashion. The circuit takes data from L1, L2 and uses MUX-es 901 and 903 to select the appropriate path based on the state variable. In FIG. 8, at the output of 885, note thermometer-encoded data D6T, D7T, and D8T. Each of these is an input to the 16:8 serializer of FIG. 9. FIG. 9 shows serializer elements associated with thermometer-encoded bit D8T. Similar elements are associated with D7T and D6T, which are retimed using latches similar to L1 905 and L2 907. The buffering after L1 results in "D8T_16_L<0>" where L means latched. The selector S1 901 takes the buffered and latched versions of the data D8T (as well as buffered and latched versions of D7T and D6T from other identical circuits omitted to avoid clutter).

With regard to FIG. 9, it is worth noting that a 16:8 serializer will serialize parallel 16$^{th}$ rate D8T_16<0:15> data bits up to parallel 8$^{th}$ rate D8T_8<0:7> data bits. In the process, a tree-like serializer structure (an exemplary portion of which is depicted) will serialize/MUX the following pairs of D8T_16 bits:

<0> and <8> (shown in the figure)
<1> and <9>
<2> and <10>
<3> and <11>
<4> and <12>
<5> and <13>
<6> and <14>
<7> and <15>.

In the 16:8 serializer 883, it is understood that similar circuitry to that of FIG. 9 will be included to serialize other thermometer-encoded DAC MSB parallel data. This circuitry would serialize parallel 16$^{th}$ rate D7T_16<0:15> data bits up to parallel 8$^{th}$ rate D7T_8<0:7> data bits, and would also serialize parallel 16$^{th}$ rate D6T_16<0:15> data bits up to parallel 8$^{th}$ rate D6T_8<0:7> data bits. Moreover, these circuits will produce outputs D7T_16_L<0:15> and D6T_16_L<0:15> which are routed to appropriate selectors S1 and S2 throughout the 16:8 serializer. These outputs are produced by latches equivalent to L1 905 and L2 907 in FIG. 9 in the sub-2:1 MUX blocks that receive input data D7T_16<0:15>and D6T_16<0:15>. By doing so the circuit implements a mapping of thermometer encoding input bits to thermometer encoded output bits, governed by a state variable. In a non-limiting example, this mapping could follow the mapping described in Table 501 of FIG. 5.

Figure 10:
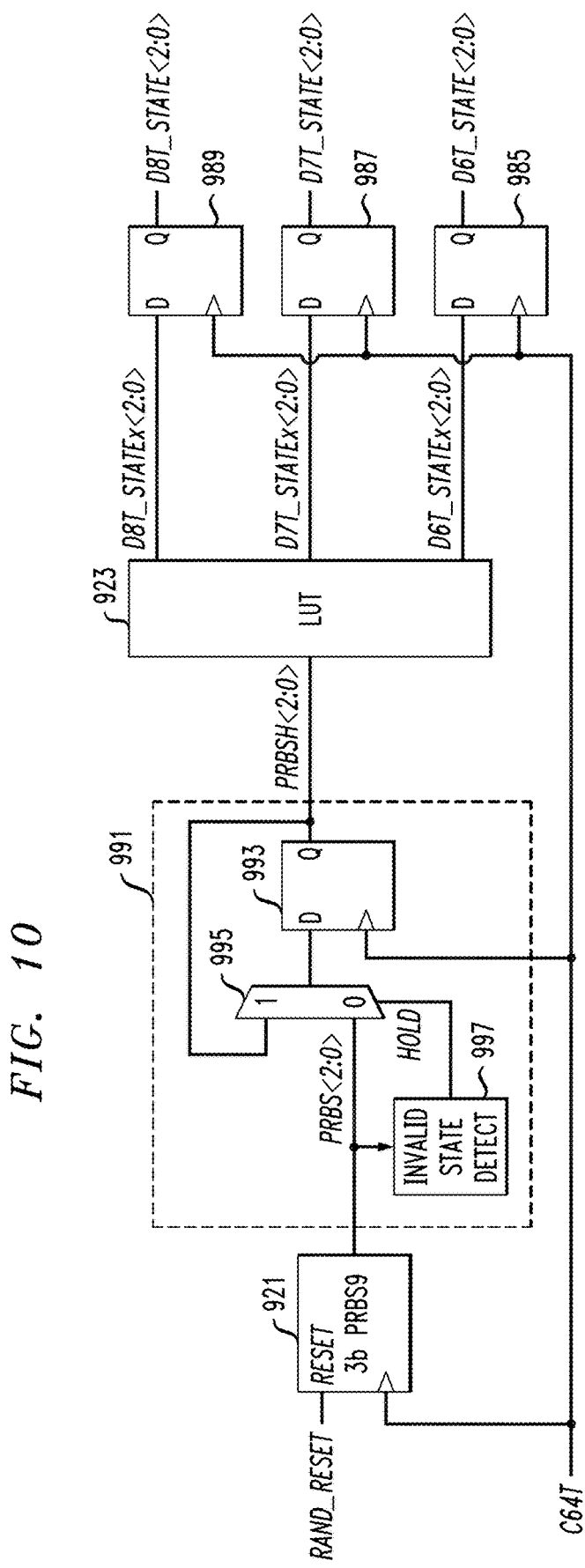
FIG. 10 shows an exemplary thermometer encoded MSB randomizer, according to an aspect of the invention.
Figure 11:
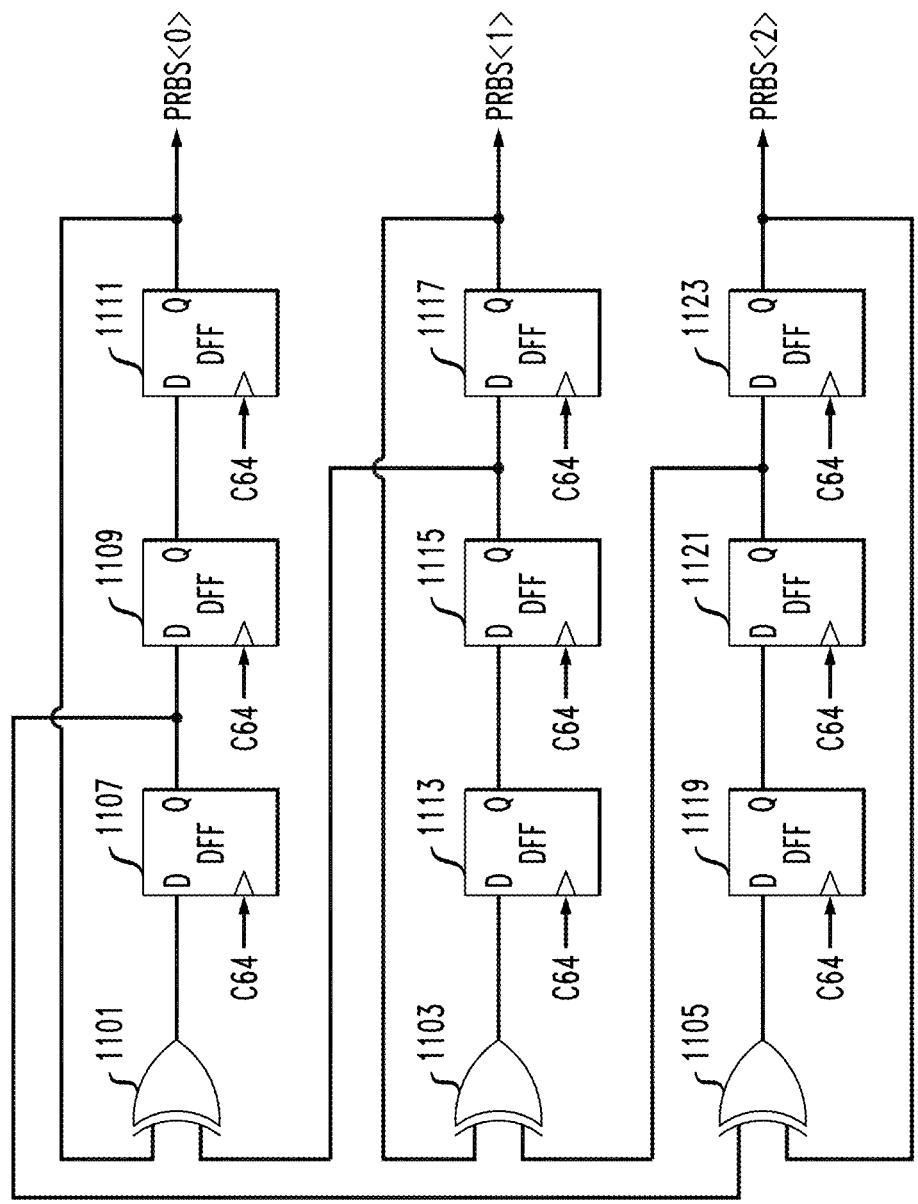
FIG. 11 shows an exemplary 3-bit PRBS9 (PRBS=pseudorandom binary sequence) generator, according to an aspect of the invention.

An example of a pseudo-randomize state generator that can be used to govern the input/output mapping of FIG. 5 is depicted in FIG. 10, which is a non-limiting example of how block 881 in FIG. 8 could be implemented. The state is pseudo-randomly generated by a 3-bit PRBS9 generator 921, details of which are shown in FIG. 11 (programmable seeding and reset functionality is not depicted in FIG. 11 to avoid clutter). This 3 b state generator 921 produces a total of eight states; however as was shown in FIG. 5, only six states are required for element selection of the 3 thermometer-encoded MSB data. Therefore, two of the eight 3 b PRBS9 states are unnecessary. A designer can select which two of the eight PRBS9 states can be deemed 'invalid' and are to be ignored if produced by the PRBS9 generator 921. The 3-bit PRBS9 output is subsequently applied to a state validator 991 circuit. When PRBS9 generator 921 generates either of the two invalid states, it will be detected by detector 997 which then asserts the HOLD signal on multiplexer 995. Upon HOLD being asserted, the Q output of latch 993 will be routed back to the input D of latch 993 by the multiplexer 995, so that the same state is maintained for another clock cycle. When the HOLD signal is not asserted (i.e., a valid state), PRBS<2:0> is provided to the input D of latch 993 by multiplexer 995. A lookup table (LUT) 923 then decodes the valid 3 b PRBS state on PRBSH<2:0> into state variables D8T_STATE, D7T_STATE, and D6T_STATE that are provided to latches 989, 987, 985 and are suitable to control selectors S1 and S2 in FIG. 9. Details of the LUT and its stored value may be dependent on the implementation of control selectors S1 and S2. As non-limiting examples, some selector implementations may require binary data to control the selection, while other selector implementations may require one-hot encoded data to control the selection. The exemplary circuit of FIG. 10 is clocked at a C64 rate (i.e., at a clock rate with a period equal to $\frac{1}{64}^{th}$ of the TX output symbol period). As such, the rate at which thermometer encoded data is dynamically assigned to TX driver elements is updated at most once every 64 TX output symbols. In a transmitter operating at 80 GBaud with an output symbol rate of 12.5 ps, this corresponds to an element selection update rate of 800 ps, which ensures sufficiently uniform driver activity to mitigate active or passive element self-heating in advanced FinFET CMOS technology nodes such as 7 nm. The inputs in FIG. 10 include a clock input C64T and a randomizer reset (RAND RESET) signal.

FIG. 11 depicts an implementation of a 3 b PRBS9 pattern generator using a linear feedback shift register (LFSR). The implementation uses a linear feedback shift register including D-type flip-flops 1107, 1109, 1111; 1113, 1115, 1117; and 1119, 1121, 1123 clocked at a C64 rate, along with XOR gates 1101, 1103, 1105 to perform binary addition as required for the generation of the PRBS9 polynomial $x^9+x^5+1$, such that a new 3 b PRBS9 state is produced each C64 clock cycle. For simplicity, the diagram does not include reset functionality depicted in FIG. 10, although it is understood that in one or more embodiments, at least one of the D-type flip-flops 1107 through 1123 must be initialized in a non-zero state.

Figure 12:
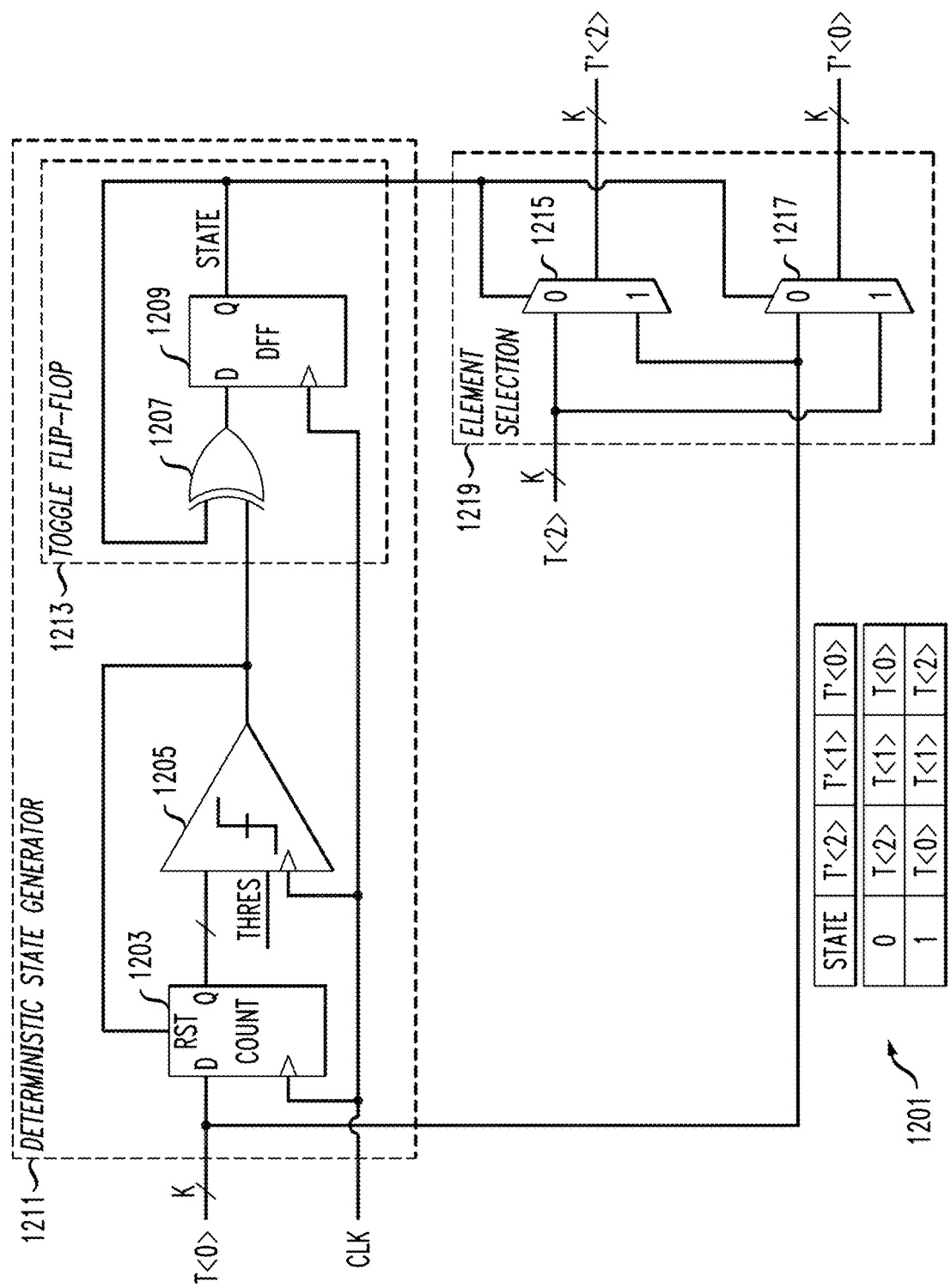
FIGS. 12, 13, and 14 are examples of deterministic element selectors, according to aspects of the invention.

Long-term DC-balancing of the data applied to the thermometer-encoded DAC elements can also be achieved if the state variable governing the element selection is updated based on the data history. An example of this approach is depicted in FIG. 12, which illustrates element selection for a DAC where the upper two binary bits are addressed using a 3-bit thermometer code. The circuit of FIG. 12 implements the mapping in table 1201, and includes a deterministic state generator 1211 with a toggle flip-flop portion 1213, and an element selector 1219. In PAM4 applications, the lower thermometer encoded bit T<0> is a logic one approximately 75% of the time, while the upper thermometer encoded bit T<2> is a logic zero approximately 75% of the time. To update the state variable, the embodiment in FIG. 12 counts the number of logic ones in the T<0>data, using counter

1203. This count is compared against a pre-determined count threshold ('THRES') by comparator 1205. Once the count reaches this threshold, the counter is reset and the state variable is toggled between two possible states via the toggle flip-flop 1213. Portion 1213 includes XOR gate 1207 and flip flop 1209. The associated element selection block 1219 swaps data T<2> and T<0> (using multiplexers 1215, 1217) to drive the associated DAC elements such that long-term DC-balancing can be achieved. In this approach, the middle thermometer encoded data bit T<1> is assumed to be DC-balanced and addressing of the associated DAC element is not governed by the element selection block.

FIG. 12 is thus an example of a deterministic state generator. In a PAM4 example, the lower thermometer encoded bit is ON about 75% and the upper thermometer encoded bit is ON about 25%. The circuit of FIG. 12 examines the lower thermometer encoded bit, which is mostly a logical '1', and counts the occurrences of logical '1' data values. This count is compared against a threshold (for example, to flag after 1000 logical '1' values have occurred). When the count is below said threshold, the comparator 1205 will produce a logical '0' output. When said threshold is reached, the same comparator will output a logical '1' which will in turn toggle the state via the toggle flip-flop 1213. Consequently, the mapping of upper and lower thermometer-encoded bits T<2> and T<0> to T'<2> and T'<0> will flip as governed by Table 1201 via the element selection circuit 1219. At the same time when comparator 1205 outputs a logical '1', counter 1203 is reset to restart this process of counting the occurrences of logical '1' data on T<0>and comparing this count against the target threshold.

FIG. 12 thus depicts deterministic element selection for DAC elements addressed by 3 thermometer encoded bits based on data history. The addressing of DAC elements from T<2> and T<0>is swapped when the absolute number of logic ones from T<0>exceeds a pre-determined threshold.

Figure 13:
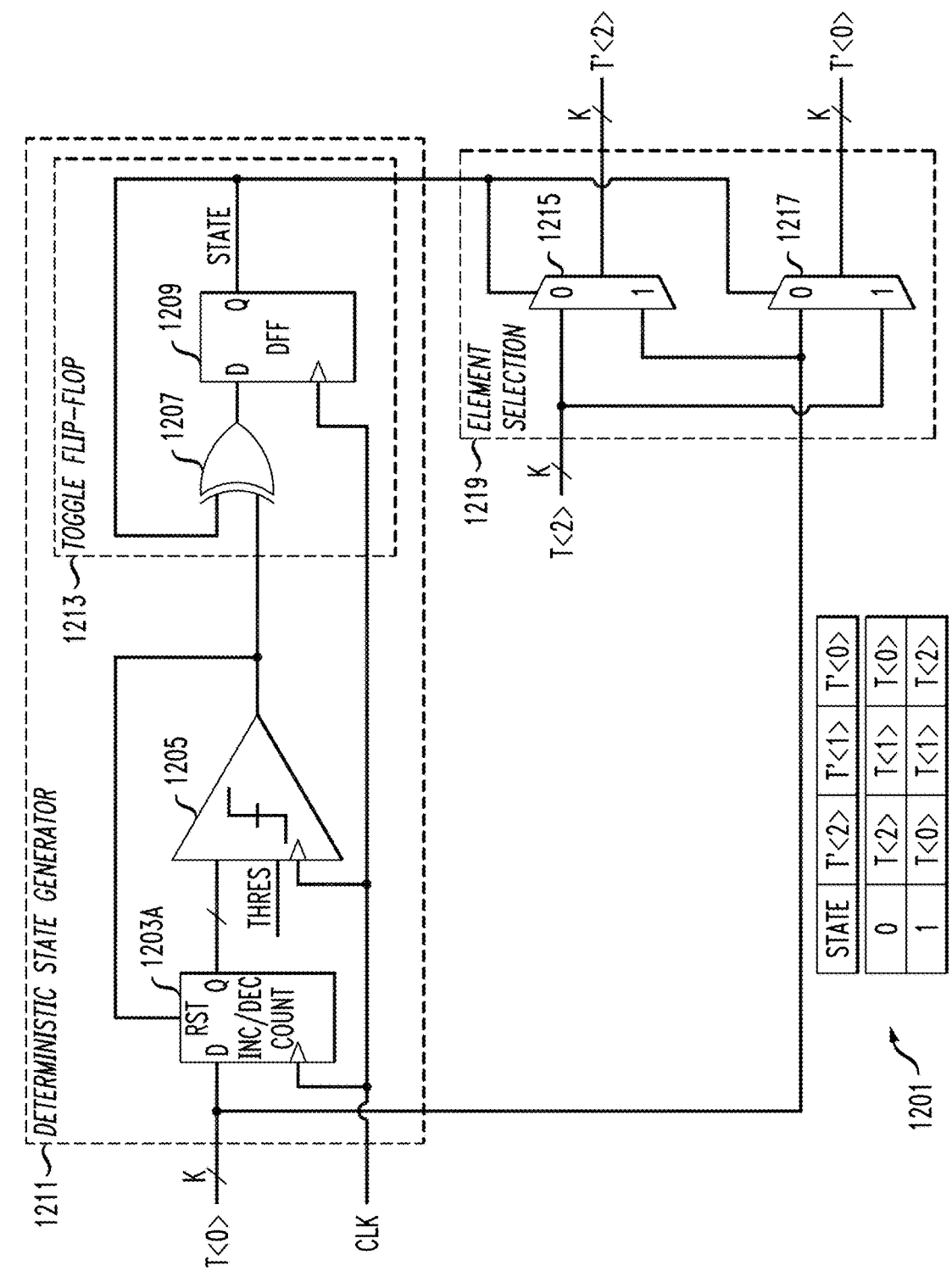

The approach in FIG. 12 could be modified to include an increment/decrement (INC/DEC) counter to sense when the average level of T<0>has exceeded a certain threshold. This approach is depicted in FIG. 13. The use of the INC/DEC counter 1203A ensures that the state is updated only when the number of logic ones from T<0> relative to the number of logic zeroes exceeds a pre-determined threshold. FIG. 13 thus depicts deterministic element selection for DAC elements addressed by 3 thermometer encoded bits based on data history. The addressing of DAC elements from T<2> and T<0> is swapped when the number of logic ones from T<0> relative to the number of logic zeroes exceeds a pre-determined threshold. The absolute value of the counter can also be compared to the threshold. FIG. 13 is thus similar to FIG. 12 except for the different counter 1203A, which is helpful, for example, in case a long string of zeroes is encountered.

Figure 14:
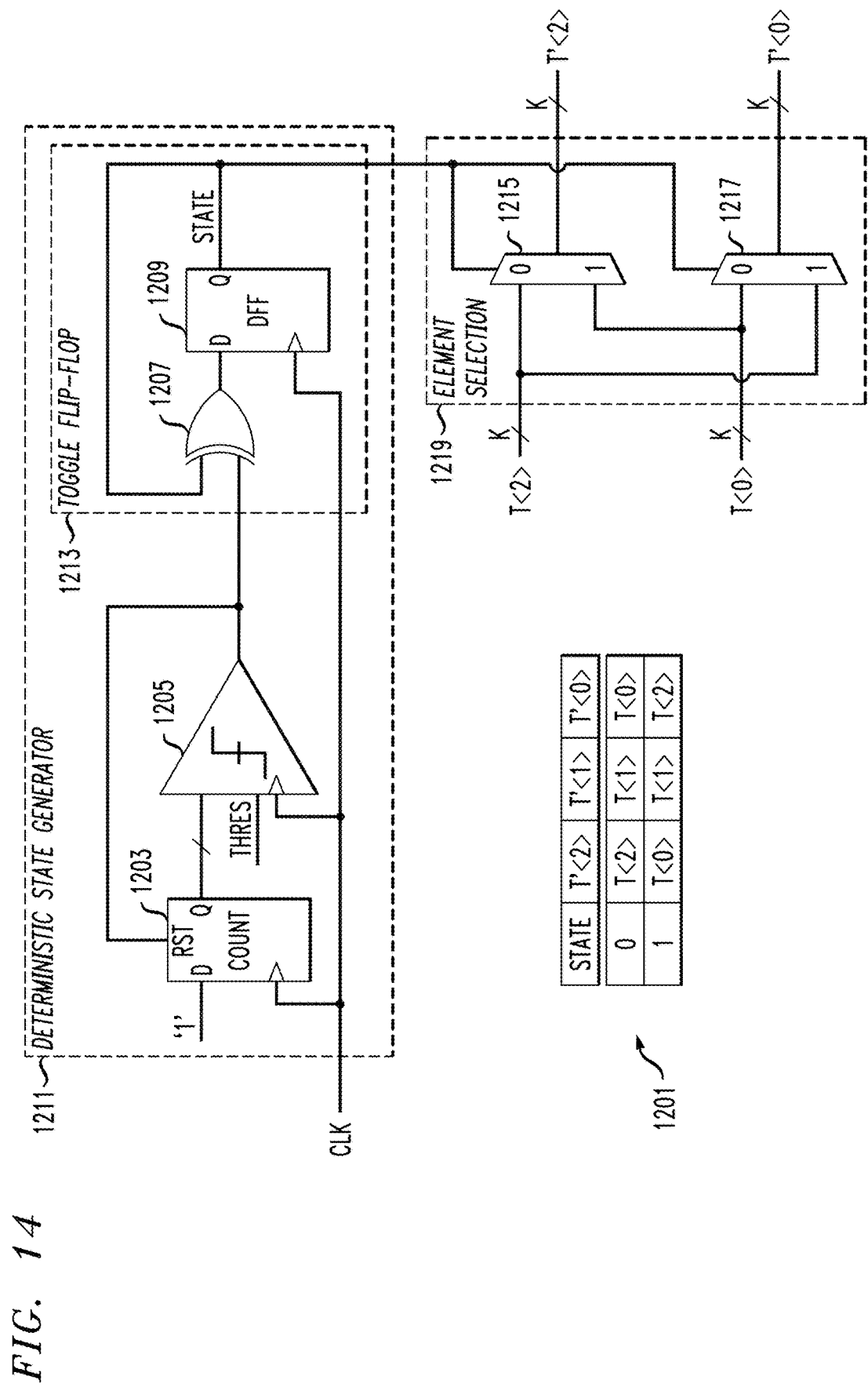

Finally, another approach for deterministic element selection, similar to that of FIG. 12, is to simply swap addressing of the upper and lower thermometer-addressed DAC elements after a pre-determined number of clock cycles as shown in FIG. 14. The output of the counter circuit increments each clock cycle and is again compared against a pre-determined threshold (' THRES'). In a non-limiting example, the value of THRES can be determined such that the update period is smaller (perhaps 10x smaller) than the time constant of thermal or EM gradients, which are typically on the order of a few microseconds. Once the cycle count exceeds THRES, the comparator again resets the counter and the state variable is toggled between two possible states via a toggle flip-flop. As this deterministic approach does not depend on data history, the implementation does not present extra loading from the state generator to the data path, and employs simpler counting circuits to save power and area as compared to the implementation of FIG. 12. FIG. 14 thus depicts deterministic element selection for DAC elements addressed by 3 thermometer encoded bits based on number of clock cycles. In FIG. 14, the D input to counter 1203 is a constant "1" input, while T<0>is input to the element selector 1219 as shown. FIGS. 12 and 13 thus consider data history, and based on that, see how often to toggle. FIG. 14 just toggles a certain fixed number of clock cycles, say, every microsecond. An advantage compared to FIGS. 12 and 13 is that the bits T2 and T0 are high speed data bits and counting as in FIGS. 12 and 13 could result in some extra loading, slow down the data path, or degrade timing margins in the serializer. Counting clock cycles is simpler. Thus, one pertinent distinction between FIG. 14 and FIGS. 12 and 13 is that the counter does not take an input from the data path, and therefore does not present loading on the data path.

To summarize, starting from cycle 0, and receiving on each cycle i an input T0[i] one or more embodiments perform a swap on cycle N, where N is found from the following equations, as the case may be:

$$sum(T0[i], i=0 \ldots N) = THRESH1 \quad (1)$$

$$abs(sum(T0[i], i=0 \ldots N) - N/2)) = THRESH2 \quad (2)$$

$$N = THRESH3 \quad (3)$$

In the above, equations (1), (2), (3) are for the embodiments of FIGS. 12, 13, 14 respectively.

It should be noted that the skilled artisan, given the teachings herein, will be able to implement the illustrated embodiments using digital circuitry (such as in the form of an integrated circuit (IC)). For example, a design process as discussed with respect to FIG. 16 can be used. The skilled artisan will be familiar with digital circuit implementations of multiplexers, comparators, logic gates, selectors, latches, encoders, flip-flops, look-up tables, clocks, drivers, delay circuits, serializers, de-serializers, state detectors, state generators, and the like, in different families of digital logic, as well as macros that may be available in same.

Figure 3:
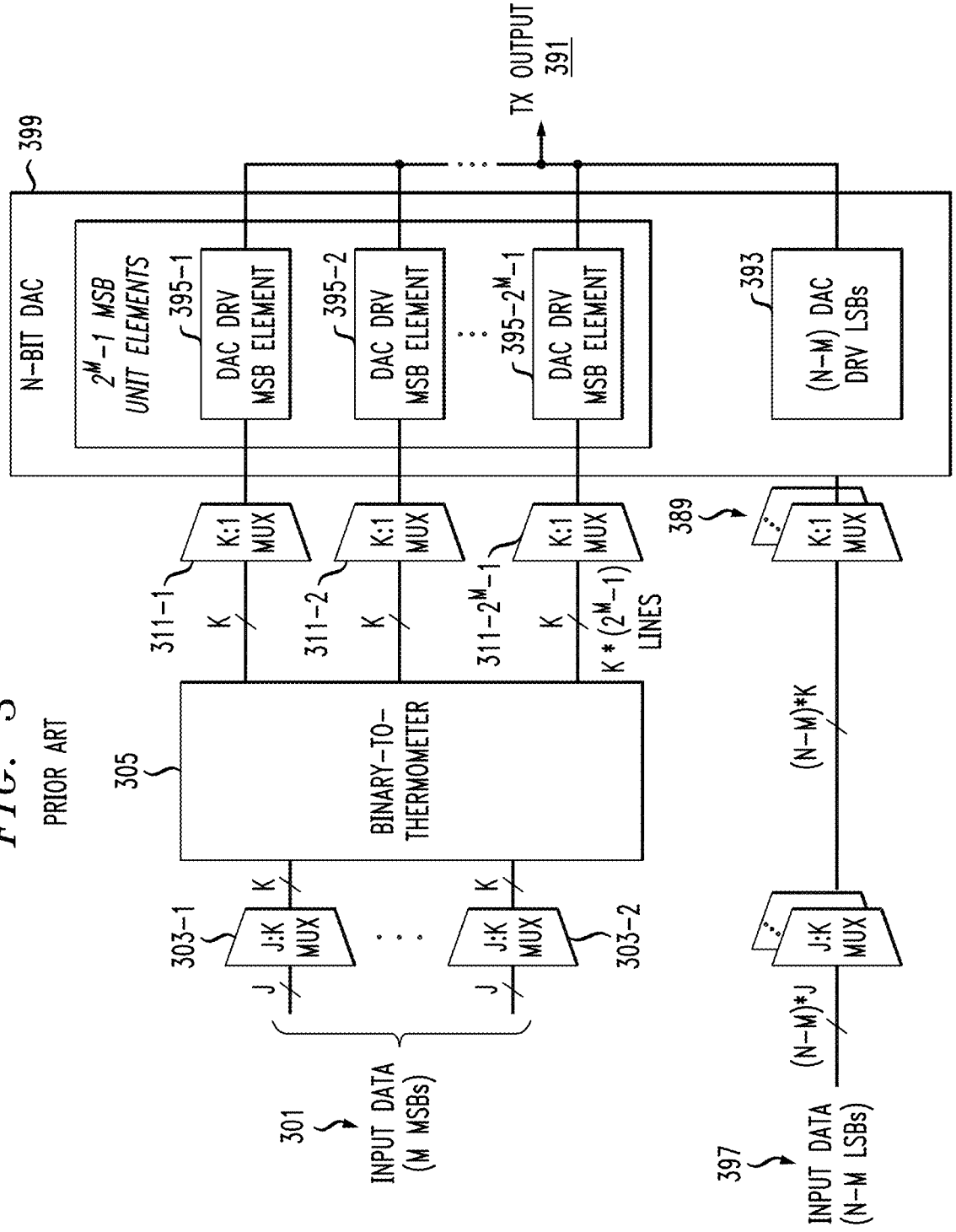
FIG. 3 shows a DAC transmitter, as known from the prior art.

It will thus be appreciated that one or more embodiments are applicable, for example, to transmitters for wireline applications. As noted, in the prior art, after binary-to-thermometer encoding, the thermometer-encoded data that reaches the input is no longer DC-balanced, which may have a negative impact on long-term matching/aging/reliability/electromigration of the device. For example, the drivers can be relatively high-power drivers driving 50 Ohm transmission lines. As noted, PAM8 may be more problematic than PAM4. In a prior art DAC approach shown in FIG. 3, equalization takes place in the digital domain and a DAC carries out wave shaping at the output. The MSBs are thermometer encoded to reduce glitching and enhance matching. The LSBs are implemented using binary-weighted segments. Once the binary-to-thermometer encoding is carried out, the data is no longer 50% ones and 50% zeroes.

One or more embodiments advantageously employ an element selection macro. After the binary-to-thermometer encoding, randomly, pseudo-randomly, or deterministically select which data goes to which driver, to make the driver activity more uniform. Parallel data comes into a write line TX, is serialized, and at some point, the data is mapped to a certain one of the drivers. This mapping can be driven by a state machine such as a pseudo-random number generator or something more complex. In one or more embodiments, the element selection unit is placed in the serializer macro to save power (in one or more embodiments, element selection takes place at a lower speed than the rate at which the data is coming out of the DAC, which saves power and/or improves timing margins).

Dynamic element matching per se is well-known, and can be used in high-resolution DACs, see Carley, to randomize the data that goes into a thermometer-encoded DAC. It is important to note that the prior art randomizes at the same rate that the DAC produces output symbols, in order to convert DAC distortion energy into white noise (i.e., uniform with respect to frequency) or spectrally-shaped noise. In a TX running at tens to hundreds of Gbps, meeting timing margins in circuit implementations intending to randomize the DAC element selection at the TX output symbol rate would be very challenging, and would result in very high power consumption. In contrast, one or more embodiments randomize at a lower rate. The prior art randomizes to mitigate DAC distortion, and could not function for its intended purpose if it randomized at a lower rate than that at which the DAC produces output symbols. In contrast, one or more embodiments can randomize at a lower rate because it is possible to carry out a slower update of the element selection and still meet the needs for a wireline TX that may need only 6-8 b (bits) of resolution. In the PAM4 TX embodiment of FIG. 4A, shuffle the data going into the 2-bit DAC for 4-level PAM. One or more embodiments can randomize at a lower rate because the effects of interest are not direct signal distortion that the DAC generates at its sample rate, as in the prior art, but rather effects such as self-heating of a device that is on 100% instead of 50%, electromigration, and the like.

One or more embodiments seek uniform long term average activity at the output of each of the drivers (i.e., the same activity or sufficiently close that thermal and electromigration effects are tolerable, as might be determined, for example, from finite element simulations or the like).

As noted, FIG. 1B shows a truth table for 2 b binary data to 3 b thermometer data encoding.

Figure 17:
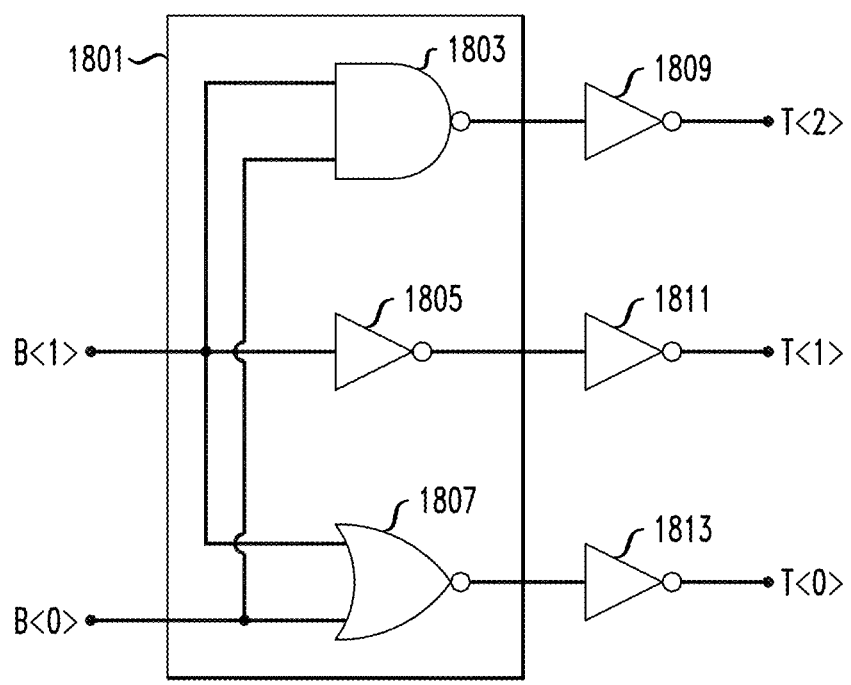
FIG. 17 is a 2 b binary data to 3 b thermometer data encoder circuit, according to aspects of the invention.

FIG. 17 shows a 2 b binary data to 3 b thermometer data encoder circuit. Note the inputs B<0> and B<1> and the outputs T<0>, T<1>, and T<2>corresponding to the truth table of FIG. 1B. Note also the portion 1801 including NAND gate 1803, NOT gate (inverter) 1805, and NOR gate 1807. Note also NOT gates (inverters) 1809, 1811, 1813 at the outputs of 1801, 1805, 1807, respectively. The circuit implements the logic 1815.

FIG. 18 shows a truth table for 3 b binary data to 7 b thermometer data encoding.

FIG. 19 shows 3 b binary data to 7 b thermometer data encoder logic functionality to implement the truth table in FIG. 18.

Figure 20:
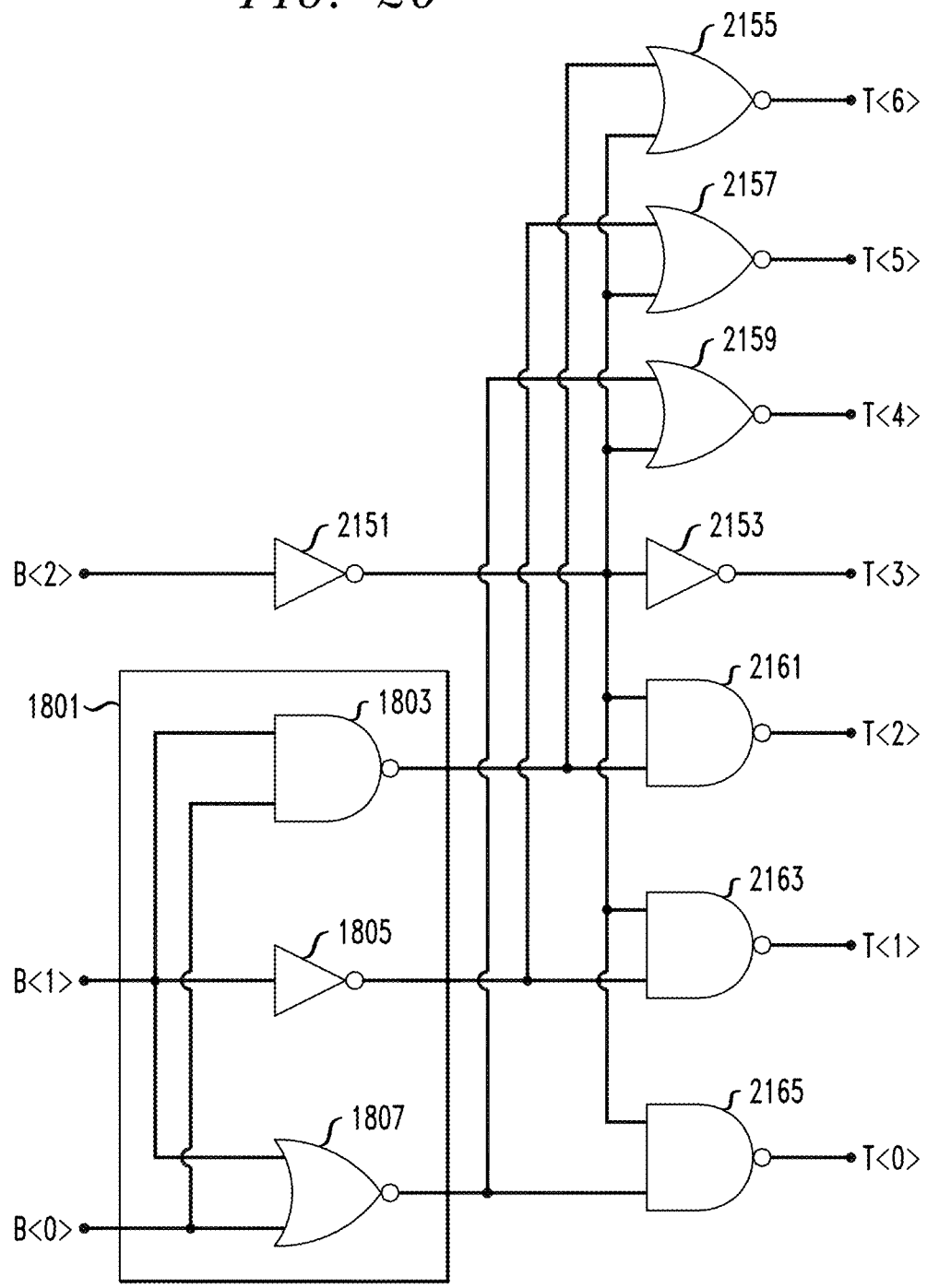
FIG. 20 is a 3 b binary data to 7 b thermometer data encoder circuit, according to aspects of the invention.

FIG. 20 shows a 3 b binary data to 7 b thermometer data encoder circuit that implements the truth table of FIG. 18 and logic of FIG. 19 (also referred to as a 3 b binary to 7 b thermometer encoder, or 3 B-to-7 T circuit). Note that the portion 1801 is the same as the portion 1801 of the 2 b binary to 3 b thermometer encoder of FIG. 18. In FIG. 20, note the inputs B<0>, B<1>, and B<2 > and the outputs T<0>, T<1>, T<2>, T<3>, T<4>, T<5>, and T<6> corresponding to the truth table of FIG. 19 and the logic of FIG. 20. Note also the NOT gates (inverters) 2151, 2153; the NAND gates 2161, 2163, and 2165; and the NOR gates 2155, 2157, 2159. The circuit implements the logic of FIG. 19.

The concept can be extended to construct higher order binary to thermometer encoders from lower order binary to thermometer encoders in a recursive fashion, by coupling the output of the lower order encoder to a network of NAND, NOR, and NOT (inverter) logic gates to produce the higher order binary to thermometer encoder. For example, this 3 B-to-7 T circuit could be used in the construction of a 4 b binary to 15 b thermometer encoder. The skilled artisan will be familiar with applying DeMorgan's theorem to the design of circuits involving simple combinational logic gates. Given the teachings herein, the skilled artisan will be able to design and implement binary to thermometer encoders of desired order.

Given the discussion thus far, it will be appreciated that, in general terms, an exemplary circuit, according to an aspect of the invention, includes at least three equally weighted driver elements DRV0, DRV1, DRV2 or DAC DRV MSB; a state variable generator 409, 809; and an element selector 407, 807, coupled to the driver elements. The selector has a first input from the state variable generator, and a second input including a plurality of input thermometer-encoded data streams, and an output of an equal number (i.e., same as the number of second inputs) of thermometer-encoded output data streams supplied to the equally weighted driver elements. The element selector is configured such that a mapping of the second input to the output is dynamically assigned based on a value of the first input from the state variable generator, with an update rate that is no more than one half of a symbol-rate (all mappings need not necessarily change at each update; for example, elements one and three could be swapped with no change for the second element, as discussed). Also included is a serializer operatively associated with the at least three equally weighted driver elements and the element selector. The serializer is configured to provide serialized data at the symbol rate, with output of the serializer coupled to one of the second input of the element selector and input of the at least three equally weighted driver elements; i.e., to convert parallel data to serial data at the symbol rate. Many different serializer configurations can be employed. Note, for example, the two columns of MUX-es in FIGS. 4A, 6A, and 7A; and the three columns of MUX-es in FIGS. 4B, 6B, and 7B (not considering the MUX-es within the drivers in FIGS. 6A and 6B). The at least three equally weighted driver elements have outputs that are combined to produce an output 415, 849 of the circuit at the symbol rate.

One or more embodiments further include a binary-to-thermometer encoder 405, 805 configured to supply the plurality of input thermometer-encoded data streams; this can be within the serializer or external to it.

In one or more embodiments, the input parallel data is DC-balanced (i.e., has an equal number of ones and zeroes), while the thermometer encoded data has different average values and switching activity; the selector balances the thermometer-encoded data to the drivers.

It is worth noting that in general, the serializer can be directly or indirectly coupled to the other elements. The plurality of thermometer-encoded data streams could be input to the serializer or could be generated by a binary-to-thermometer encoder in the serializer, for example.

As noted, in one or more embodiments, the element selector is configured such that a mapping of the second input to the output is dynamically assigned based on a value of the first input from the state variable generator, with an update rate that is no more than one half of a symbol-rate. In some cases, the update rate is no more than ten percent of the symbol-rate. In some cases, update the state variable every 1-10 ns. In some cases, the update rate is no more than a fraction of the symbol-rate selected to achieve uniform self-heating of a device and/or to reduce electromigration.

Referring to FIGS. 4A and 4B, in some cases, the at least three equally weighted driver elements include individual drivers.

Referring to FIGS. 6A and 6B, in some cases, the at least three equally weighted driver elements each include: a delay block 631; a plurality of multiplexers 633-1, 633-2, . . . , 633-M coupled to the delay block; and a plurality of sub-driver elements 613-1-1, 613-1-2, . . . , 613-1-M implementing weights of a feed-forward equalization scheme.

In at least some such cases, within given ones of the equally weighted driver elements, at least two of the plurality of sub-driver elements have different weights. Furthermore, in at least some such cases, across the equally weighted driver elements, corresponding ones of the plurality of sub-driver elements have identical weights.

Referring to FIGS. 7A and 7B, some embodiments further include a digital-to-analog converter 899 coupled to the serializer; the at least three equally weighted driver elements each include most significant bit driver elements 855-1, 855-2, . . . , 855-$2^M$-1 within the digital-to-analog converter.

At least some such embodiments further include a binary-to-thermometer encoder 805 configured to supply the plurality of input thermometer-encoded data streams. The digital-to-analog converter includes an N-bit digital-to-analog converter, wherein M most significant bits of parallel input data are applied to the binary-to-thermometer encoder and the element selector, and wherein the digital-to-analog converter further includes a digital-to-analog converter driver 853 for N-M least significant bits of the parallel input data.

Again, some embodiments further include a binary-to-thermometer encoder configured to supply the plurality of input thermometer-encoded data streams; in some cases, the binary-to-thermometer encoder has outputs coupled to inputs of the element selector, and the serializer includes: a first plurality of multiplexers having inputs configured to receive parallel input data and having outputs coupled to the binary-to-thermometer encoder; and a second plurality of multiplexers having inputs coupled to the element selector and having outputs coupled to the equally weighted driver elements.

In one or more embodiments, the outputs of the at least three equally weighted driver elements are coupled to an optical communications element 489, 689, 789 such as a Mach-Zehnder interferometer used as an electro-optic modulator for phase and amplitude modulation of light, or a vertical cavity surface emitting laser (VCSEL).

The state variable generator can be a deterministic state variable generator; for example, such as shown in FIGS. 12, 13, and 14. For example, as in FIG. 14, the deterministic state variable generator can be configured to swap one or more pairs of the at least three equally weighted driver elements after a predetermined number of clock cycles; as in FIG. 12, the deterministic state variable generator can be configured to swap one or more pairs of the at least three equally weighted driver elements when a number of logical ones at a first input to the element selector exceeds a predetermined threshold; or, as in FIG. 13, the deterministic state variable generator is configured to swap one or more pairs of the at least three equally weighted driver elements when an average input level at a first input to the element selector exceeds a predetermined threshold. The concept can be extended for DACs employing 7 b thermometer encoding or higher. For example in the DAC of FIG. 7A with M=3, for the purpose of achieving balanced activity it would be beneficial to swap pairs of thermometer encoded data supplied to the inputs of the following DAC element pairs: 855-1/855-7, 855-2/855-6, and 855-3/855-5. Note that these criteria can be used for any type of switching/toggling, not just the swapping of the pairs of elements.

Various techniques can be used to pick THRES. For example, it may be desirable to toggle at least once every nanosecond, but at no more than half the symbol rate. The high end may be limited, for example, by power, but at the low end it may be necessary to toggle fast enough to prevent non-uniform heating. In general, for example, carry out a finite element simulation for thermal and electromigration to determine the desired cycle time and relate that back to the clock cycles/thresholds—this will depend, for example, on thermal time constant of the circuit, as would be appreciated by the skilled artisan.

The state variable generator can also be a random state variable generator or a pseudo-random state variable generator; see, e.g., FIGS. 10 and 11.

In another aspect, an exemplary method (e.g., of operating a circuit/transmitter as described herein), includes with an element selector 407, 807, coupled to at least three equally weighted driver elements DRV0, DRV1, DRV2 or DAC DRV MSB, obtaining a first input from a state variable generator 409, 809, and a second input including a plurality of input thermometer-encoded data streams. A further step includes, with the element selector, outputting an equal number of thermometer-encoded output data streams to the equally weighted driver elements. A still further step includes, with the element selector, dynamically mapping the second input to the output based on a value of the first input from the state variable generator, with an update rate that is no more than one half of a symbol-rate. An even further step includes, with a serializer operatively associated with the at least three equally weighted driver elements and the element selector, providing serialized data at the symbol-rate, with output of the serializer coupled to one of the second input of the element selector and input of the at least three equally weighted driver elements. As noted above, many different serializer configurations can be employed; these can be connected in many different ways, as discussed. Yet a further step includes combining outputs of the at least three equally weighted driver elements to produce an output 415, 849 of the circuit at the symbol rate. An optional step includes using a binary-to-thermometer encoder 405, 805 to supply the plurality of input thermometer-encoded data streams.

Figure 15:
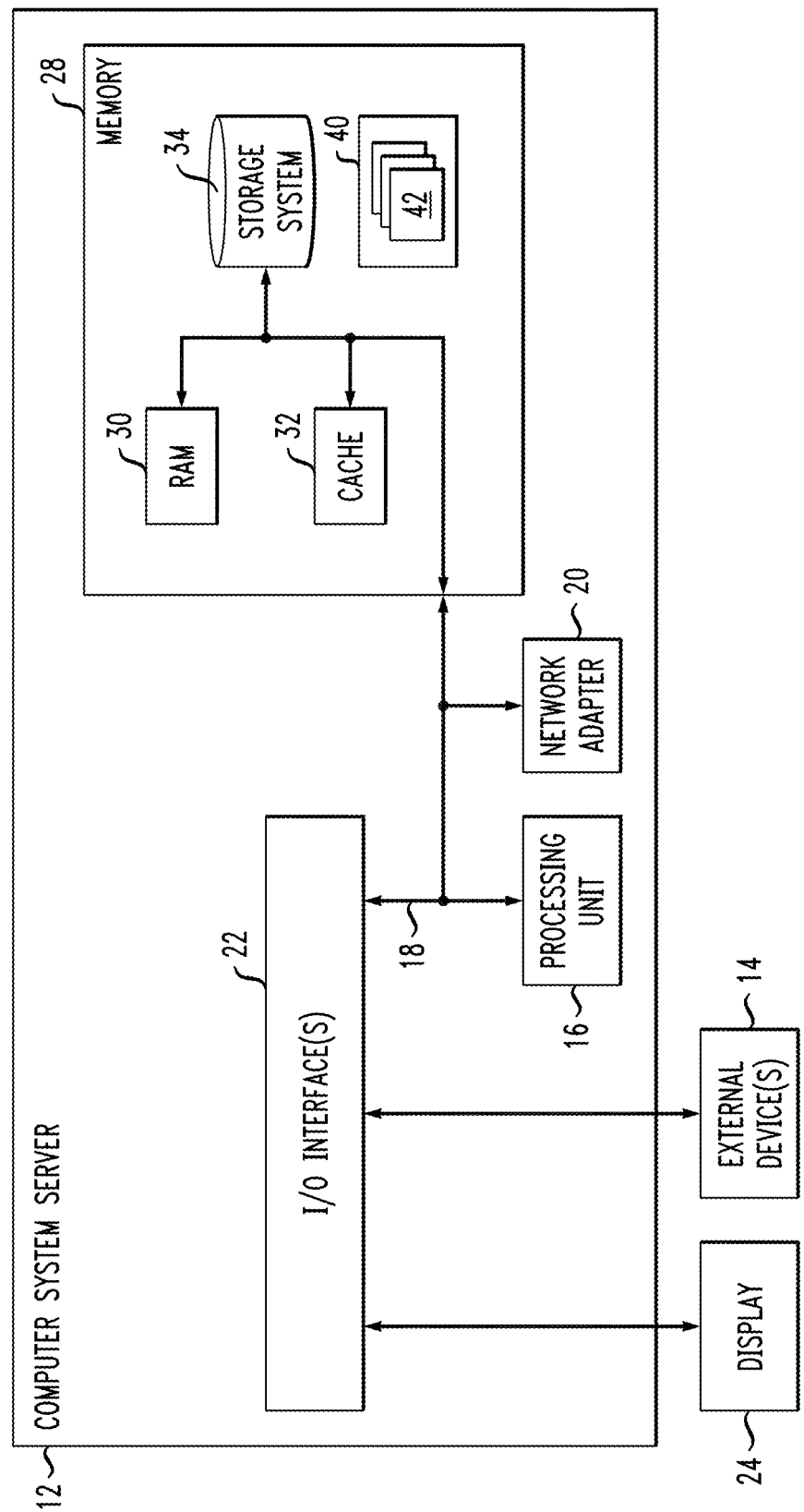
FIG. 15 depicts a computer system that could implement a design process such as that shown in FIG. 16)

FIG. 15 depicts a computer system 12 that can be used, for example, to carry out a design process as described below with respect to FIG. 16. Computer system 12 includes, for example, one or more processors or processing units 16, a system memory 28, and a bus 18 that couples various system components including system memory 28 to processor 16. Element 16 can connect to the bus, for example, with suitable bus interface units.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below memory 28 may include at least one program product having a set (e.g., at least one) of program modules that are configured to carry out, e.g., a design process as shown in FIG. 16.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out software-implemented functions and/or methodologies.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Still with reference to FIG. 15, note processor 16, memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing desired tasks, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 15) running a server program. It will be understood that such a physical server may or may not include a display and keyboard. Furthermore, FIG. 15 is representative of a conventional general-purpose computer that could be used, for example, to implement aspects of the design process described below.

EXEMPLARY DESIGN PROCESS USED IN SEMICONDUCTOR DESIGN, MANUFACTURE, AND/OR TEST

One or more embodiments of hardware in accordance with aspects of the invention can be implemented using techniques for semiconductor integrated circuit design simulation, test, layout, and/or manufacture. In this regard, FIG. 16 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

Figure 16:
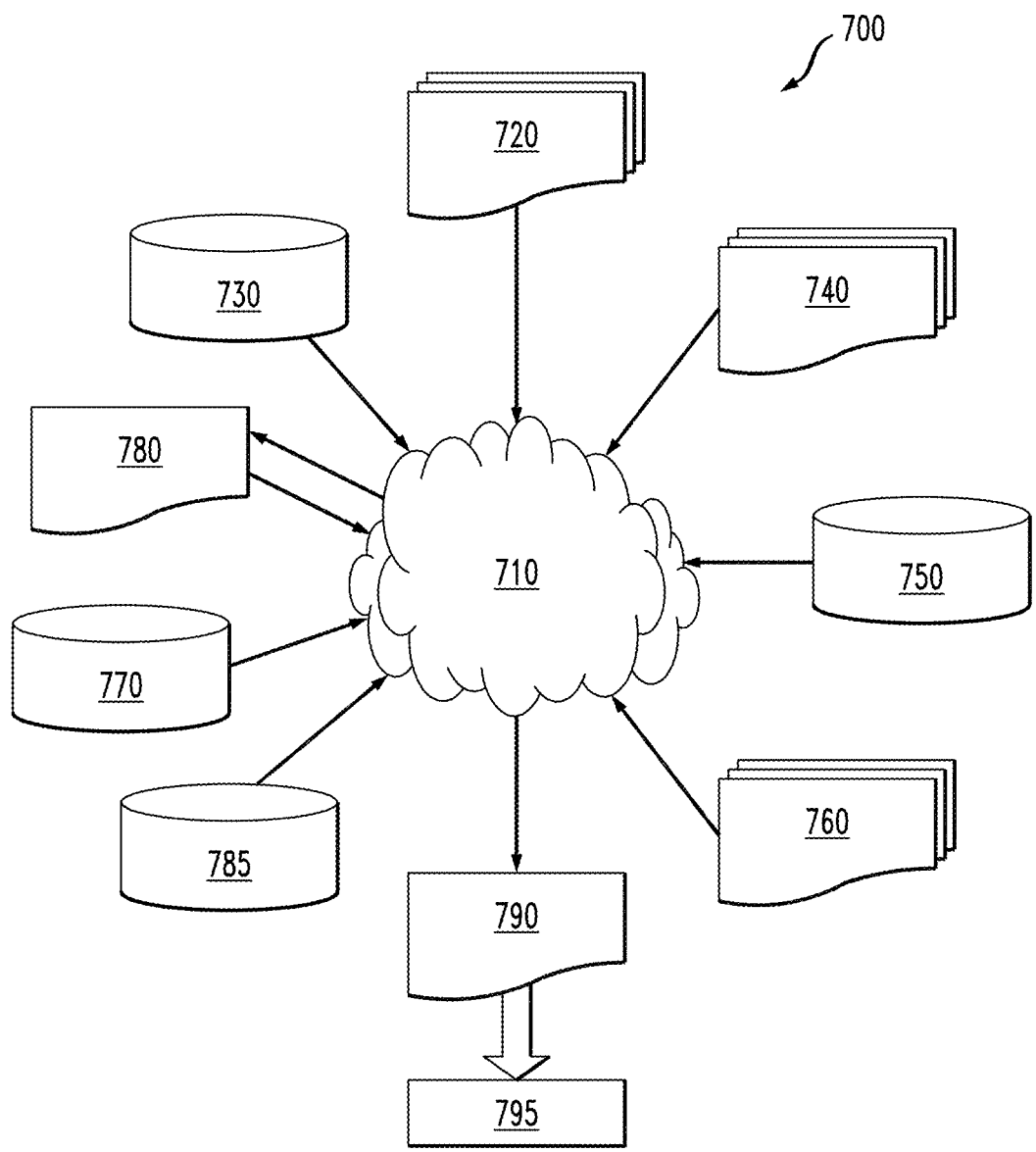
FIG. 16 is a flow diagram of a design process used in semiconductor design, manufacture, and/or test.

FIG. 16 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like as disclosed herein. In one embodiment, design structure 790 may comprise a compiled, executable HDL simulation model that functionally simulates the devices disclosed herein.

Design structure 790 may also employ a data format used for the exchange of layout data of integrated circuits and/or symbolic data format (e.g., information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein. Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
    at least three equally weighted driver elements;
    a state variable generator;
    an element selector, coupled to the driver elements, having a first input from the state variable generator, and a second input comprising a plurality of input thermometer-encoded data streams, and an output of an equal number of thermometer-encoded output data streams supplied to the equally weighted driver elements, wherein the element selector is configured such that a mapping of the second input to the output is dynamically assigned based on a value of the first input from the state variable generator, with an update rate that is no more than one half of a symbol-rate; and
    a serializer operatively associated with the at least three equally weighted driver elements and the element selector, the serializer being configured to provide serialized data at the symbol rate, with output of the serializer coupled to one of the second input of the element selector and input of the at least three equally weighted driver elements;
    wherein the at least three equally weighted driver elements have outputs that are combined to produce an output of the circuit at the symbol rate and wherein the state variable generator is configured to swap one or more pairs of the at least three equally weighted driver elements when a given characteristic of data at a first input to the element selector exceeds a predetermined threshold.

2. The circuit of claim 1, further comprising a binary-to-thermometer encoder configured to supply the plurality of input thermometer-encoded data streams.

3. The circuit of claim 2, wherein the binary-to-thermometer encoder is located within the serializer.

4. The circuit of claim 2, wherein the binary-to-thermometer encoder is external to the serializer.

5. The circuit of claim 1, wherein the at least three equally weighted driver elements comprise individual drivers.

6. The circuit of claim 1, wherein the at least three equally weighted driver elements each comprise:
    a delay block;
    a plurality of multiplexers coupled to the delay block; and
    a plurality of sub-driver elements implementing weights of a feed-forward equalization scheme.

7. The circuit of claim 6, wherein, within given ones of the equally weighted driver elements, at least two of the plurality of sub-driver elements have different weights.

8. The circuit of claim 7, wherein, across the equally weighted driver elements, corresponding ones of the plurality of sub-driver elements have identical weights.

9. The circuit of claim 1, further comprising a digital-to-analog converter coupled to the serializer, wherein the at least three equally weighted driver elements each comprise most significant bit driver elements within the digital-to-analog converter.

10. The circuit of claim 9, further comprising a binary-to-thermometer encoder configured to supply the plurality of input thermometer-encoded data streams, wherein the digital-to-analog converter comprises an N-bit digital-to-analog converter, wherein M most significant bits of parallel input data are applied to the binary-to-thermometer encoder and the element selector, and wherein the digital-to-analog converter further includes a digital-to-analog converter driver for N-M least significant bits of the parallel input data.

11. The circuit of claim 1, further comprising a binary-to-thermometer encoder configured to supply the plurality of input thermometer-encoded data streams, wherein the binary-to-thermometer encoder has outputs coupled to inputs of the element selector, and wherein the serializer comprises:
    a first plurality of multiplexers having inputs configured to receive parallel input data and having outputs coupled to the binary-to-thermometer encoder; and
    a second plurality of multiplexers having inputs coupled to the element selector and having outputs coupled to the equally weighted driver elements.

12. The circuit of claim 1, wherein the outputs of the at least three equally weighted driver elements are coupled to an optical communications element.

13. The circuit of claim 1, wherein the state variable generator comprises a deterministic state variable generator.

14. The circuit of claim 13, wherein the deterministic state variable generator is configured to swap one or more pairs of the at least three equally weighted driver elements after a predetermined number of clock cycles.

15. The circuit of claim 1, wherein the given characteristic of data at the first input to the element selector is a count of logical ones.

16. The circuit of claim 1, wherein the given characteristic of data at the first input to the element selector is an average input level.

17. The circuit of claim 1, wherein the state variable generator comprises one of a random state variable generator and a pseudo-random state variable generator.

18. A method comprising:
    with an element selector, coupled to at least three equally weighted driver elements, obtaining a first input from a state variable generator, and a second input comprising a plurality of input thermometer-encoded data streams;
    with the element selector, outputting of an equal number of thermometer-encoded output data streams to the equally weighted driver elements;
    with the element selector, dynamically mapping the second input to the output based on a value of the first input from the state variable generator, with an update rate that is no more than one half of a symbol-rate, by swapping one or more pairs of the at least three equally weighted driver elements when a given characteristic of data at a first input to the element selector exceeds a predetermined threshold;
    with a serializer operatively associated with the at least three equally weighted driver elements and the element selector, providing serialized data at the symbol-rate, with output of the serializer coupled to one of the second input of the element selector and input of the at least three equally weighted driver elements; and
    combining outputs of the at least three equally weighted driver elements to produce an output of the circuit at the symbol rate.

19. A hardware description language (HDL) design structure encoded on a non-transitory machine-readable data storage medium, the HDL design structure comprising elements that when processed in a computer-aided design system generates a machine-executable representation of an apparatus, wherein the HDL design structure comprises:

at least three equally weighted driver elements;

a state variable generator;

an element selector, coupled to the driver elements, having a first input from the state variable generator, and a second input comprising a plurality of input thermometer-encoded data streams, and an output of an equal number of thermometer-encoded output data streams supplied to the equally weighted driver elements, wherein the element selector is configured such that a mapping of the second input to the output is dynamically assigned based on a value of the first input from the state variable generator, with an update rate that is no more than one half of a symbol-rate; and a serializer operatively associated with the at least three equally weighted driver elements and the element selector, the serializer being configured to provide serialized data at the symbol rate, with output of the serializer coupled to one of the second input of the element selector and input of the at least three equally weighted driver elements;

wherein the at least three equally weighted driver elements have outputs that are combined to produce a circuit output at the symbol rate and wherein the state variable generator is configured to swap one or more pairs of the at least three equally weighted driver elements when a given characteristic of data at a first input to the element selector exceeds a predetermined threshold.

20. The design structure of claim 19, further comprising a binary-to-thermometer encoder configured to supply the plurality of input thermometer-encoded data streams.

* * * * *